(12) United States Patent
Clark

(10) Patent No.: US 10,626,720 B2
(45) Date of Patent: Apr. 21, 2020

(54) MEASURING INSTRUMENTS, SYSTEMS AND MAGNETIC GRADIOMETERS

(71) Applicant: Commonwealth Scientific and Industrial Research Organisation, Acton ACT (AU)

(72) Inventor: David Alan Clark, Lexington, KY (US)

(73) Assignee: Commonwealth Scientific and Industrial Research Organisation, Australian Capital Territory (AU)

( * ) Notice: Subject to any disclaimer, the term of this patent is extended or adjusted under 35 U.S.C. 154(b) by 245 days.

(21) Appl. No.: 15/747,012

(22) PCT Filed: Jul. 22, 2016

(86) PCT No.: PCT/AU2016/050655
§ 371 (c)(1),
(2) Date: Jan. 23, 2018

(87) PCT Pub. No.: WO2017/015704
PCT Pub. Date: Feb. 2, 2017

(65) Prior Publication Data
US 2018/0209266 A1 Jul. 26, 2018

(30) Foreign Application Priority Data
Jul. 24, 2015 (AU) ................. 2015902956

(51) Int. Cl.
*E21B 49/00* (2006.01)
*G01R 33/022* (2006.01)
(Continued)

(52) U.S. Cl.
CPC ............ *E21B 49/00* (2013.01); *E21B 47/022* (2013.01); *G01R 33/022* (2013.01); *G01V 3/26* (2013.01); *G01R 33/04* (2013.01)

(58) Field of Classification Search
None
See application file for complete search history.

(56) References Cited

U.S. PATENT DOCUMENTS

| 4,489,274 A | 12/1984 | Berlincourt |
| 5,341,681 A * | 8/1994 | Molny ................. G01V 7/02 73/382 G |

(Continued)

FOREIGN PATENT DOCUMENTS

| WO | WO 2004/015435 A1 | 2/2004 |
| WO | WO 2015/016917 A1 | 2/2015 |

OTHER PUBLICATIONS

Satellite Borne Gravity Gradiometer Study Report No. 6413-95000, Mar. 1976, pp. 1-62 (Year: 1976).*

(Continued)

*Primary Examiner* — Roy Y Yi
(74) *Attorney, Agent, or Firm* — Brinks Gilson & Lione

(57) ABSTRACT

Embodiments generally relate to a measuring instrument. The measuring instrument may comprise: a sensor to measure a property of the local environment; a mechanism configured to cause the sensor to move along a predetermined path relative to a fixed reference frame of the instrument; and a signal processing system configured to receive a processor sensor signal generated by the sensor, perform a Fourier transform on the sensor signal to identify frequency components of the sensor signal, and compare the frequency components of the sensor signal with frequency components associated with the predetermined path to determine a measurement of the property of the local environment. The mechanism may comprise a first member having a first axis and a second axis that is different from the first axis. The mechanism may be configured to cause the first member and the sensor to rotate about the first axis, and to cause the sensor to rotate about the second axis. The sensor may be (Continued)

spatially offset from the first axis. The sensor may be configured to measure one or more vector components of a local force field, such as a magnetic field, for example, and the measuring instrument may comprise a magnetometer or magnetic gradiometer, for example. The measuring instruments disclosed may be suited to downhole applications, such as in a measurement while drilling system, for example.

20 Claims, 14 Drawing Sheets

(51) Int. Cl.
    *G01V 3/26*     (2006.01)
    *E21B 47/022*     (2012.01)
    *G01R 33/04*     (2006.01)

(56) References Cited

U.S. PATENT DOCUMENTS

| | | |
|---|---|---|
| 5,357,802 A | 10/1994 | Hofmeyer et al. |
| 5,818,352 A | 10/1998 | McClure |
| 7,508,202 B2 | 3/2009 | Tilbrook |
| 2014/0257731 A1* | 9/2014 | Konda .................. G01C 17/38 702/89 |
| 2015/0022192 A1 | 1/2015 | Ausserlechner |
| 2015/0354958 A1* | 12/2015 | Honkura ................ G01C 19/58 702/151 |

OTHER PUBLICATIONS

International Search Report and Written Opinion for International Patent Application No. PCT/AU2016/050655, dated Aug. 15, 2016 (11 pages).

International Preliminary Report on Patentability for International Patent Application No. PCT/AU2016/050655 dated Jul. 4, 2017 (15 pages).

Phillip Schmidt et al., "Getmag—A Squid magnetic tensor gradiometer for mineral and oil exploration," *Exploration Geophysics*, 2004, vol. 5, No. 4, pp. 297-305.

Extended European Search Report for corresponding EP Application No. 16829491.6, dated Jan. 31, 2019, 9 pages.

\* cited by examiner

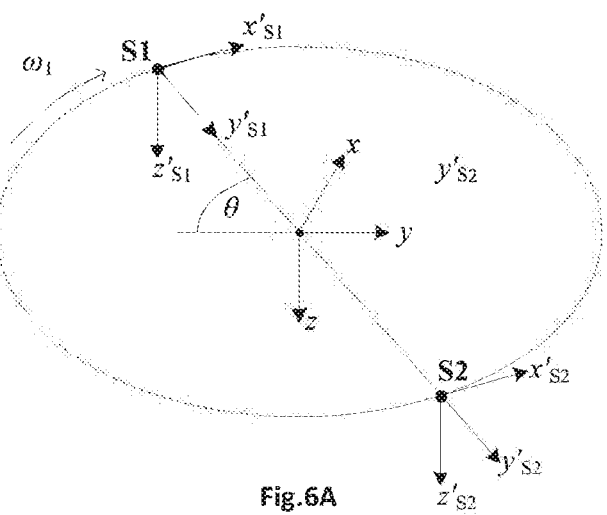
Fig.6A
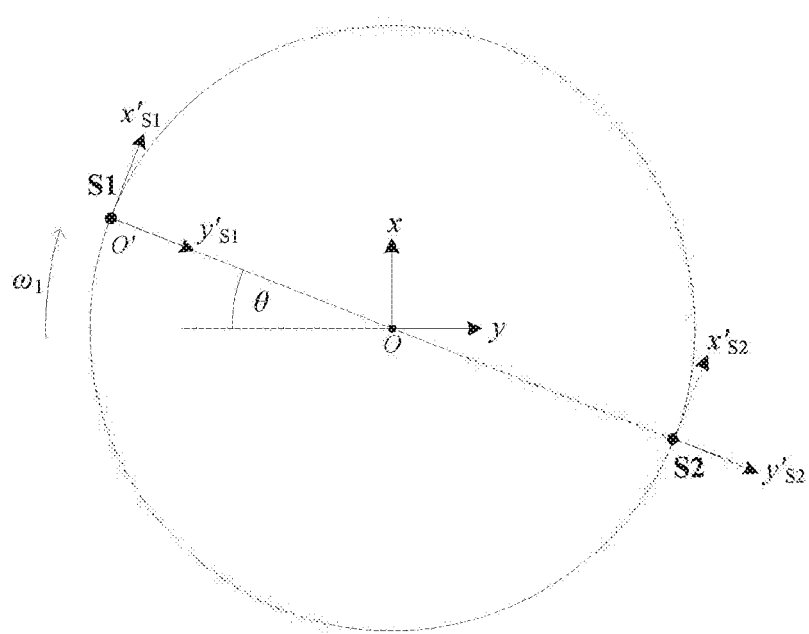
Fig.6B
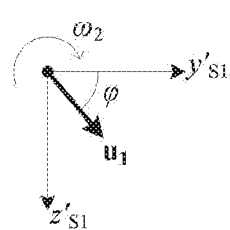 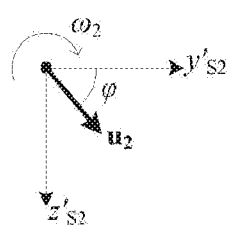
Fig.6C  Fig.6D

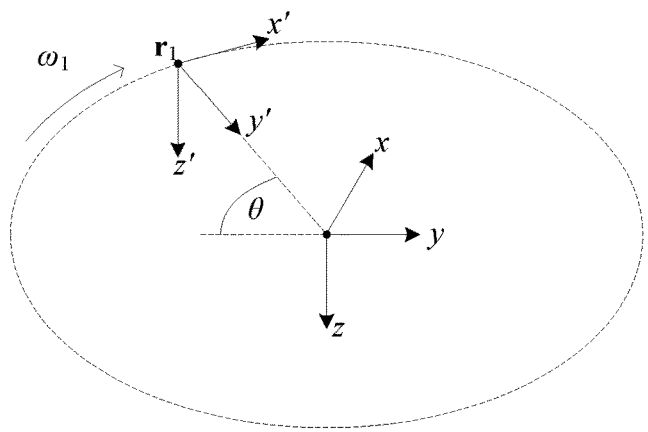
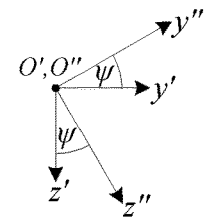
Fig.8D
Fig.8A
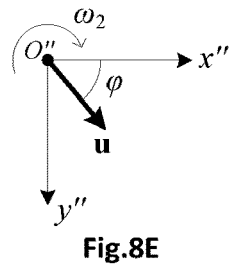
Fig.8E
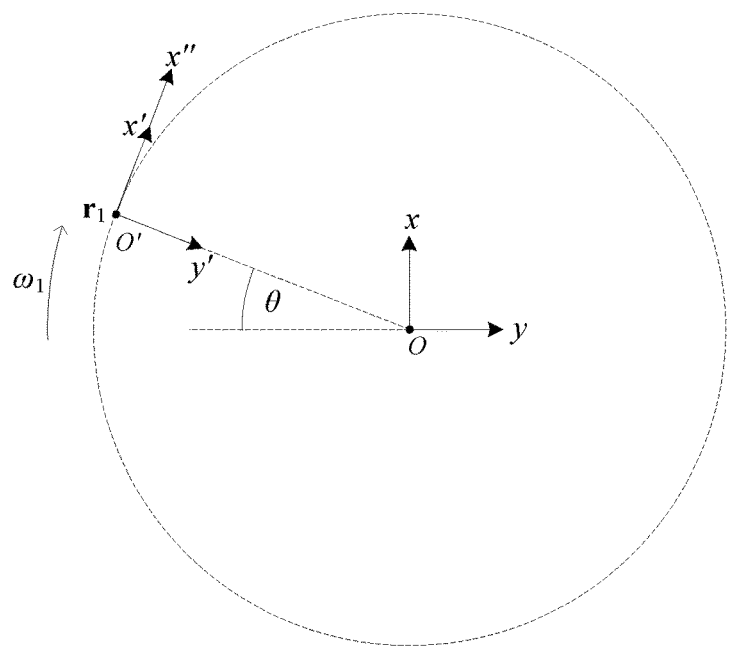
Fig.8B
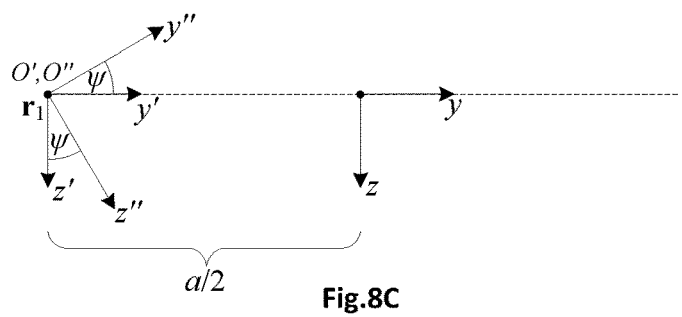
Fig.8C

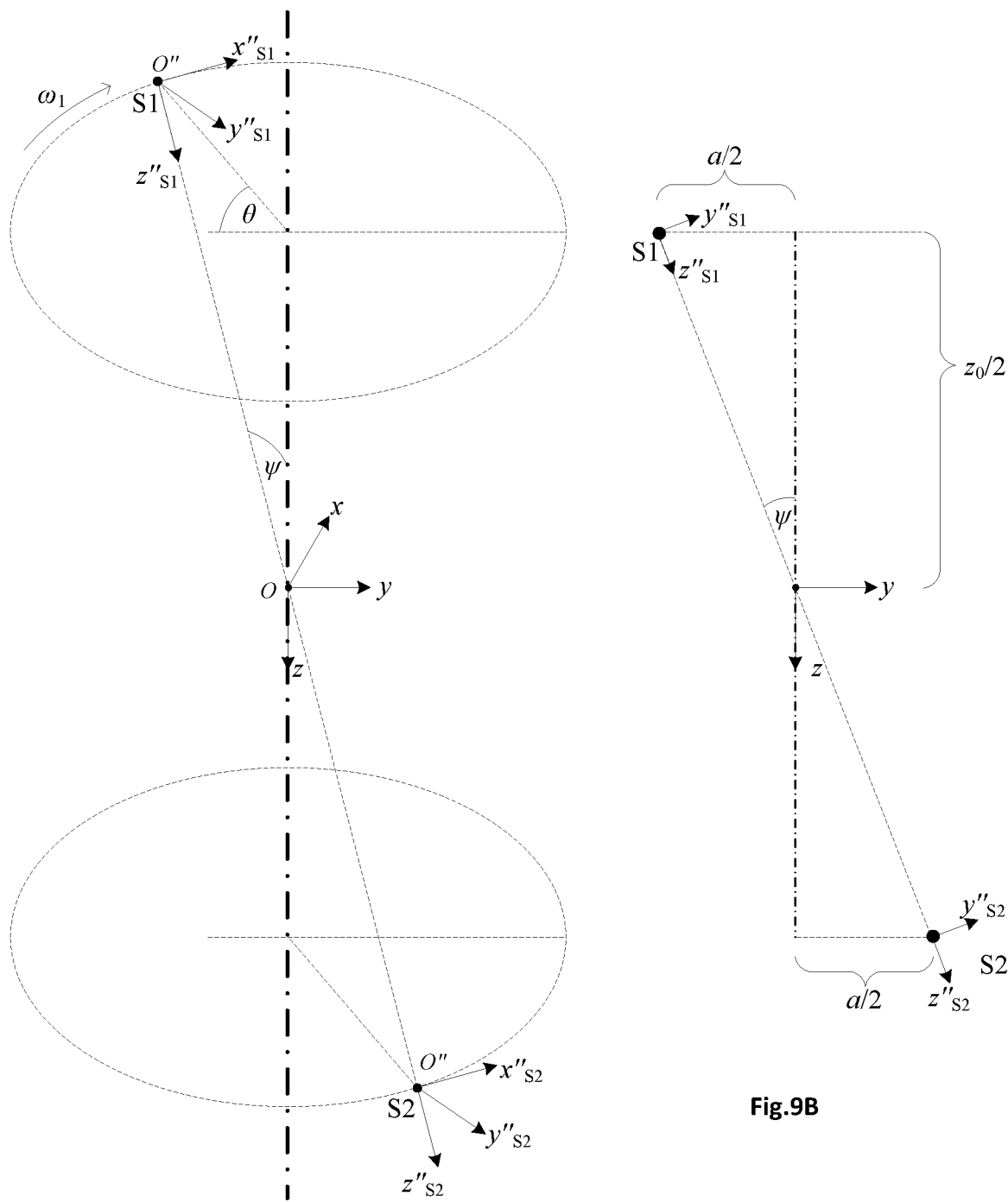
Fig.9A
Fig.9B
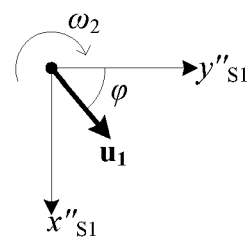
Fig.9C
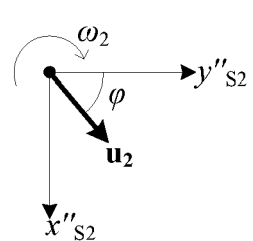
Fig.9D

MEASURING INSTRUMENTS, SYSTEMS AND MAGNETIC GRADIOMETERS

CROSS-REFERENCE TO RELATED APPLICATIONS

This application is a National Stage of International Application No. PCT/AU2016/050655 filed with the Australian Patent Office on Jul. 22, 2016, which claims priority to Australian patent application No. 2015/902,956 filed Jul. 24, 2015, wherein the entirety of each of the aforementioned applications is hereby incorporated herein by reference.

TECHNICAL FIELD

Embodiments generally relate to measuring instruments, systems and methods, and in particular to magnetic gradiometers.

BACKGROUND

Various instruments, systems and methods are known for measuring physical quantities. For example, magnetic gradiometers may be used for measuring physical quantities such as magnetic fields, for example.

However, existing magnetic gradiometers have some drawbacks associated with them, particularly when used for certain applications such as in a borehole for use in mining, for example.

It is desired to address or ameliorate one or more problems, disadvantages or drawbacks of prior measuring instruments, systems or methods, or to at least provide a useful alternative thereto.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

SUMMARY

Some embodiments relate to a measuring instrument comprising: a sensor to measure a property of the local environment; a mechanism configured to cause the sensor to move along a predetermined path relative to a fixed reference frame of the instrument; and a signal processing system configured to receive a sensor signal generated by the sensor, perform a Fourier transform on the sensor signal to identify frequency components of the sensor signal, and compare the frequency components of the sensor signal with frequency components associated with the predetermined path to determine a measurement of the property of the local environment; wherein the mechanism comprises a first member, wherein the first member has a first axis and a second axis that is different from the first axis, wherein the mechanism is configured to cause the first member and the sensor to rotate about the first axis, and to cause the sensor to rotate about the second axis, and wherein the sensor is spatially offset from the first axis.

The sensor may be spatially offset from the second axis. The second axis may be spatially offset from the first axis. The second axis may be perpendicular to the first axis. The second axis may be inclined at an acute angle relative to the first axis.

There may be a first angular velocity associated with rotation of the sensor and the first member about the first axis and a second angular velocity associated with rotation of the sensor about the second axis. Rotation of the sensor and the first member about the first axis may be coupled to rotation of the sensor about the second axis such that the first angular velocity is related to the second angular velocity by a predetermined ratio between the first and second angular velocities. In some embodiments, the first and second angular velocities may be variable with time. In some embodiments, the first and second angular velocities may be constant.

In some embodiments, the mechanism may comprise a first sub-mechanism to cause the first member and the sensor to rotate about the first axis; and a second sub-mechanism to cause the sensor to rotate about the second axis. The second sub-mechanism may comprise the first member. The first sub-mechanism may comprise a support to support the first member. The first member may comprises an elongate arm. The second sub-mechanism may further comprise an arm extension to spatially offset the sensor from the second axis.

In some embodiments, the Fourier transform may be performed by a fast Fourier transform chip in the signal processing system. The signal processing system may be further configured to perform a Fourier transform on the sensor signal to identify frequency components of the sensor signal for comparison with frequency components associated with the predetermined path. The signal processing system may further comprise a signal processor to receive the sensor signal and a computer processor to analyse and compare the frequency components of the sensor signal with frequency components associated with the predetermined path.

The sensor may be configured to measure any one or more of: a vector component of a local force field, multiple vector components of a local force field, and the field strength of a local force field. The force field may be a magnetic field, electric field, or gravitational field, for example. The measuring instrument may comprise a magnetic gradiometer. The sensor may comprise a total magnetic intensity magnetometer. The sensor may comprise a uniaxial magnetometer. The sensor may comprise a fluxgate magnetometer.

In some embodiments, the sensor may be a first sensor and the measuring instrument may further comprise a second sensor offset from the first axis on an opposite side of the first axis from the first sensor, wherein the mechanism is configured to cause the second sensor to rotate about the first axis in the same direction and with the same angular velocity as the first sensor and to cause the second sensor to rotate about the second axis in the same direction and with the same angular velocity as the first sensor. Rotation of the second sensor about the second axis may be out of phase relative to rotation of the first sensor about the second axis. Rotation of the second sensor about the second axis may be about ninety degrees (90°) out of phase relative to rotation of the first sensor about the second axis.

In other embodiments, the measuring instrument may further comprise a second member having a third axis which is different from the first and second axes, wherein the mechanism is configured to cause the second member to rotate about the first axis. The second member may be coupled to the first member or may be coupled to the mechanism. The sensor may be a first sensor and the measuring instrument may further comprise a second sensor, wherein the mechanism is configured to cause the second sensor to rotate about the first axis in the same direction and with the same angular velocity as rotation of the first sensor about the first axis and to cause the second sensor to rotate about the third axis in the same direction and with the same angular velocity as rotation of the first sensor about the second axis.

Rotation of the second sensor about the first axis may be out of phase relative to rotation of the first sensor about the first axis. Rotation of the second sensor about the first axis may be about one hundred and eighty degrees (180°) out of phase relative to rotation of the first sensor about the first axis. Rotation of the second sensor about the third axis may be out of phase relative to rotation of the first sensor about the second axis. Rotation of the second sensor about the third axis may be about ninety degrees (90°) out of phase relative to rotation of the first sensor about the second axis.

In some embodiments, the measuring instrument may further comprise a third sensor offset from the first axis and a fourth sensor offset from the first axis on an opposite side of the first axis from the third sensor, wherein the mechanism is configured to cause each of the third and fourth sensors to rotate about the first axis in the same direction and with the same angular velocity as rotation of the first and second sensors about the first axis, and wherein the mechanism is configured to cause each of the third and fourth sensors to rotate about the third axis in the same direction and with the same angular velocity as rotation of the first and second sensors about the second axis.

Rotation of the fourth sensor about the third axis may be out of phase relative to rotation of the third sensor about the third axis. Rotation of the fourth sensor about the third axis may be about ninety degrees (90°) out of phase relative to rotation of the third sensor about the third axis. Rotation of the third and fourth sensors about the first axis may be out of phase relative to rotation of the first and second sensors about the first axis. Rotation of the third and fourth sensors about the third axis may be out of phase relative to rotation of the first and second sensors about the second axis.

The third axis may parallel to the second axis. The third axis may be spatially offset from the second axis. The third axis may be spatially offset from the second axis in a direction parallel to the first axis. The third axis may be spatially offset from the first axis. The third axis may be perpendicular to the first axis. The third axis may be inclined at an acute angle relative to the first axis.

In some embodiments, the signal processing system is configured to receive all sensor signals generated by the sensors, perform a Fourier transform on each of the sensor signals to identify frequency components of the sensor signals, and compare frequency components of the sensor signals with frequency components associated with predetermined paths of the sensors to determine measurements of the property of the local environment. The Fourier transforms may be performed by one or more fast Fourier transform chips in the signal processing system. The signal processing system may comprise a signal processor to receive the sensor signals and a computer processor to analyse and compare the frequency components of the sensor signals with frequency components associated with the predetermined paths of the sensors.

The sensors may be configured to measure any one or more of: a vector component of a local force field, multiple vector components of a local force field, and the field strength of a local force field. the sensors comprise total magnetic intensity magnetometers. The force field may be a magnetic field, electric field, or gravitational field, for example. The measuring instrument may comprise a magnetic gradiometer. The sensors may comprise total magnetic intensity magnetometers. The sensors may comprise uniaxial magnetometers. The sensors may comprise fluxgate magnetometers.

In some embodiments, the measuring instrument may further comprise an actuator coupled to and configured to drive the mechanism. The actuator may comprise an electric motor or a turbine, for example. The measuring instrument may further comprise a controller connected to the actuator to control the actuator.

In some embodiments, the measuring instrument may further comprise one or more angular position sensors connected to the signal processor to provide angular position information for one or more components of the mechanism.

The measuring instrument may further comprise a power source to power operation of the measuring instrument. The power source may power any one or more of: the actuator or actuators, the controller, the sensor or sensors, the signal processing system, the signal processor, and the computer processor.

Some embodiments relate to a measuring instrument comprising a magnetic gradiometer, the magnetic gradiometer comprising: a single uniaxial magnetometer; a mechanism configured to move the magnetometer along a predetermined path relative to a fixed reference frame of the measuring instrument; and a signal processing system configured to receive a magnetometer signal generated by the magnetometer, perform a Fourier transform on the magnetometer signal to identify frequency components of the magnetometer signal, and compare frequency components of the magnetometer signal with frequency components associated with the predetermined path to determine two or more independent components of a magnetic gradient tensor of the local magnetic field.

In some embodiments, the motion of the magnetometer along the predetermined path may allow two, three, four or five independent components of the magnetic gradient tensor to be determined by comparing frequency components of the magnetometer signal with frequency components associated with the predetermined path.

Some embodiments relate to a measuring instrument comprising a magnetic gradiometer, the magnetic gradiometer comprising: a single total magnetic intensity magnetometer; a mechanism configured to move the magnetometer along a predetermined path relative to a fixed reference frame of the measuring instrument; and a signal processing system configured to receive a magnetometer signal generated by the magnetometer, perform a Fourier transform on the magnetometer signal to identify frequency components of the magnetometer signal, and compare frequency components of the magnetometer signal with frequency components associated with the predetermined path to determine a total magnetic intensity and two or more components of a vector gradient of the total magnetic intensity of a local magnetic field.

The Fourier transform may be performed by a fast Fourier transform chip in the signal processing system. The signal processing system may comprise a signal processor to receive the magnetometer signal and a computer processor to analyse and compare frequency components of the magnetometer signal with frequency components associated with the predetermined path.

In some embodiments, the measuring instrument may further comprise one or more angular position sensors coupled to the mechanism to provide a reference for comparing frequency components of the magnetometer signal with frequency components associated with the predetermined path.

In some embodiments, the measuring instrument may further comprise one or more further magnetometers to provide further data to assist in determining one or more characteristics of the local magnetic field by comparing frequency components of magnetometer signals from the one or more further magnetometers with frequency components associated with predetermined paths of the one or more further magnetometers.

In some embodiments, the single total magnetic intensity magnetometer may be a first total magnetic intensity magnetometer and the measuring instrument may further comprise a second total magnetic intensity magnetometer, wherein the predetermined path of the first magnetometer is a circular orbit, and wherein the mechanism is further configured to move the second magnetometer along the predetermined path on an opposing side of the circular orbit to the first magnetometer.

Some embodiments relate to a magnetic detection system comprising a measuring instrument according to any one of the described measuring instruments. Some embodiments relate to a surveying system comprising a measuring instrument according to any one of the described measuring instruments. Some embodiments relate to a measurement while drilling system comprising a measuring instrument according to any one of the described measuring instruments.

Some embodiments relate to a drilling system comprising a measuring instrument according to any one of the described measuring instruments. The drilling system may further comprise: a drill bit for cutting a borehole in rock or earth; a drill string to drive the drill bit, the drill string having a lumen to deliver drilling mud to the drill bit; and a drilling rig to drive rotation of the drill string and drill bit.

In some embodiments, at least part of the measuring instrument may be mounted to the drill string. At least part of the mechanism of the measuring instrument may be driven by the drilling rig. At least part of the mechanism of the instrument may be driven by drilling mud pressure via a turbine coupled to the mechanism.

In some embodiments, the first sub-mechanism may comprise the drill string. And in some embodiments, the second sub-mechanism may comprise a turbine positioned within the lumen of the drill string to drive the second sub-mechanism.

In some other embodiments, the second sub-mechanism may comprise an electric motor. The motor may be powered by a generator that is powered by a drilling mud turbine, for example, or another suitable electric power source.

Some embodiments relate to a method for simultaneously measuring two magnetic field components and two magnetic gradient components using a single uniaxial magnetic field sensor following a circular orbit relative to a magnetic field.

Some embodiments relate to a method for simultaneously measuring three magnetic field components and five independent components of the complete magnetic gradient tensor using two uniaxial magnetic field sensors following circular orbits relative to a magnetic field, the two orbits being axially offset relative to an axis of rotation of the orbits.

Some embodiments relate to a method for simultaneously measuring the total magnetic intensity and two components of the vector gradient of the total magnetic intensity using a single scalar magnetic sensor following a circular orbit relative to a magnetic field.

Some embodiments relate to a method for simultaneously measuring the total magnetic intensity and three components of the vector gradient of the total magnetic intensity using two scalar magnetic sensors following circular orbits relative to a magnetic field, the two orbits being axially offset relative to an axis of rotation of the orbits.

Some embodiments relate to a method for simultaneously measuring three magnetic field components and four magnetic gradient components using a single uniaxial magnetic field sensor that undergoes orbital motion while spinning about a different axis. The different axis may be aligned with a radius of the orbital motion or may be aligned tangentially to the orbital motion. In some embodiments, the different axis may be inclined relative to the radius, the tangent, or both the radius and the tangent of the orbital motion.

Some embodiments relate to a method for simultaneously measuring three magnetic field components and the complete magnetic gradient tensor using two uniaxial magnetic field sensors that undergo orbital motion while spinning about a different axis, as described above, the two orbits being axially offset relative to an axis of rotation of the orbits.

Some embodiments relate to a method for simultaneously measuring three magnetic field components and four magnetic gradient components using dual uniaxial magnetic field sensors that undergo orbital motion while spinning about a different axis, as described above. The dual sensors following the same orbital path while being located on opposite sides of the orbit.

Some embodiments relate to a method for simultaneously measuring three magnetic field components and the complete magnetic gradient tensor using two dual uniaxial magnetic field sensors, as described above.

Some embodiments relate to a method for simultaneously measuring three magnetic field components and the complete magnetic gradient tensor using dual uniaxial magnetic field sensors that undergo antipodal precessional motion while spinning about a precessing axis.

Some embodiments relate to a method for simultaneously measuring three magnetic field components and the complete magnetic gradient tensor using a single uniaxial magnetic field sensor that undergoes orbital motion about a first axis while simultaneously orbiting a second axis which is orthogonal to the first axis.

BRIEF DESCRIPTION OF DRAWINGS

Embodiments are described in further detail, by way of example, with reference to the accompanying drawings, in which:

FIG. 6A is a perspective view of a dual sensor configuration according to some embodiments, each sensor S1 and S2 following a similar trajectory to the trajectory of FIG. 5A;

FIG. 6B is a plan view of the configuration of FIG. 6A;

FIG. 6C is an orthogonal view of the z'y'-plane of the X'$_{S1}$-frame of FIG. 4A showing the rotation of a sensitive axis u$_1$ of the sensor S1 about the x'$_{S1}$-axis;

FIG. 6D is an orthogonal view of the z'y'-plane of the X'$_{S2}$-frame of FIG. 6A showing the rotation of a sensitive axis u$_2$ of the sensor S2 about the x'$_{S2}$-axis;

FIG. 8A is a perspective view of a sensor trajectory of a sensor moving with respect to a first reference frame X of an instrument according to some embodiments, the sensor orbits an origin of the first reference frame X with a second reference frame X';

FIG. 8B is a plan view of the trajectory of FIG. 8A;

FIG. 8C is a side view of the trajectory of FIG. 8A;

FIG. 8D is an orthogonal view of the z'y'-plane of FIG. 8A showing the relative inclination of a third reference frame X" with respect to the second reference frame X';

FIG. 8E is an orthogonal view of the x"y"-plane of the third reference frame X" of FIG. 8D showing the rotation of a sensitive axis u of the sensor about the z"-axis;

FIG. 9A is a perspective view of a dual sensor configuration according to some embodiments, each sensor following a similar trajectory to the trajectory of FIG. 8A with a third reference frame X"$_{S1}$ of a first sensor S1 and a third reference frame X"$_{S2}$ of a second sensor S2;

FIG. 9B is a side view of the configuration of FIG. 9A;

FIG. 9C is an orthogonal view of the x"y"-plane of the X"$_{S1}$-frame of FIG. 9A, looking along the z"$_{S1}$-axis, showing the rotation of a sensitive axis u$_1$ of the sensor S1 about the z"$_{S1}$-axis;

FIG. 9D is an orthogonal view of the x"y"-plane of the X"$_{S2}$-frame of FIG. 9A, looking along the −z"$_{S2}$-axis, showing the rotation of a sensitive axis u$_2$ of the sensor S2 about the z"$_{S2}$-axis;

DESCRIPTION OF EMBODIMENTS

Figure 1:
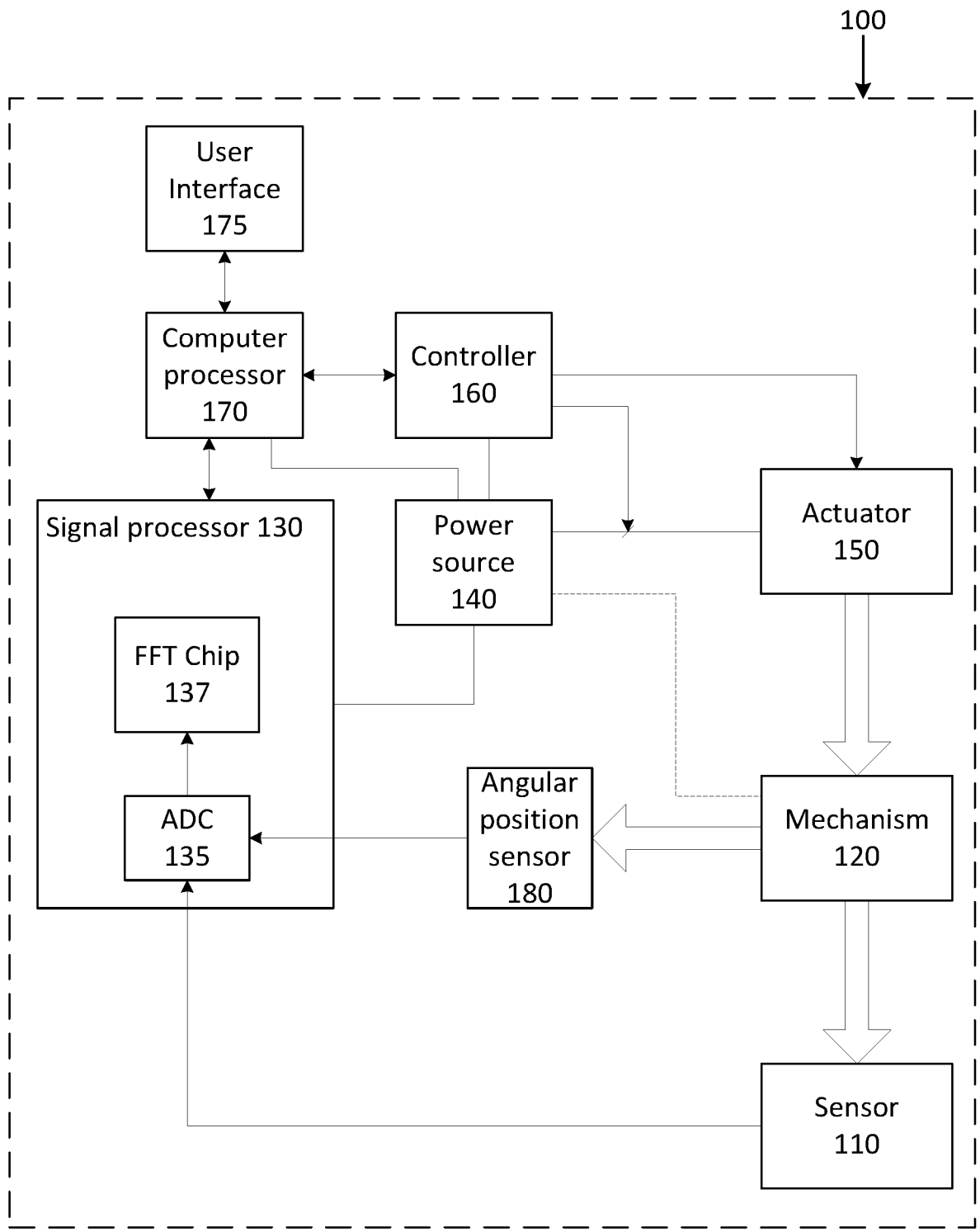
FIG. 1 is a block diagram of a measurement instrument according to some embodiments.
Figure 2A:
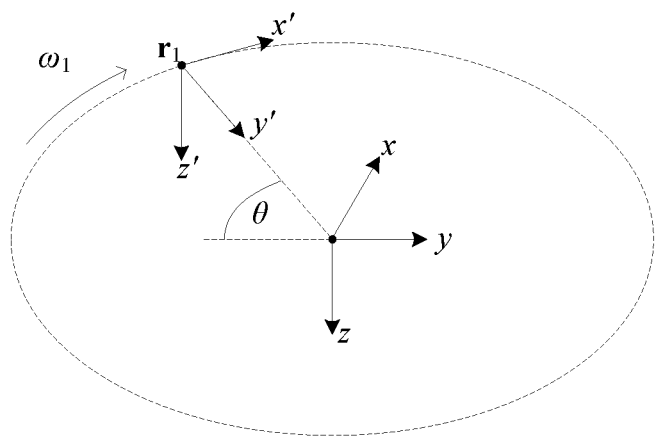
FIG. 2A is a perspective view of a sensor trajectory of a sensor moving with respect to a first reference frame X of an instrument according to some embodiments, the sensor orbits an origin of the first reference frame X with a second reference frame X'.
Figure 2D:
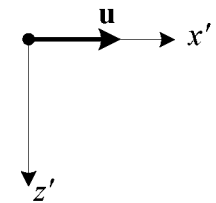
FIG. 2D is an orthogonal view of the x'z'-plane of the second reference frame X' of FIG. 2A showing the relative orientation of a sensitive axis u of the sensor.
Figure 2B:
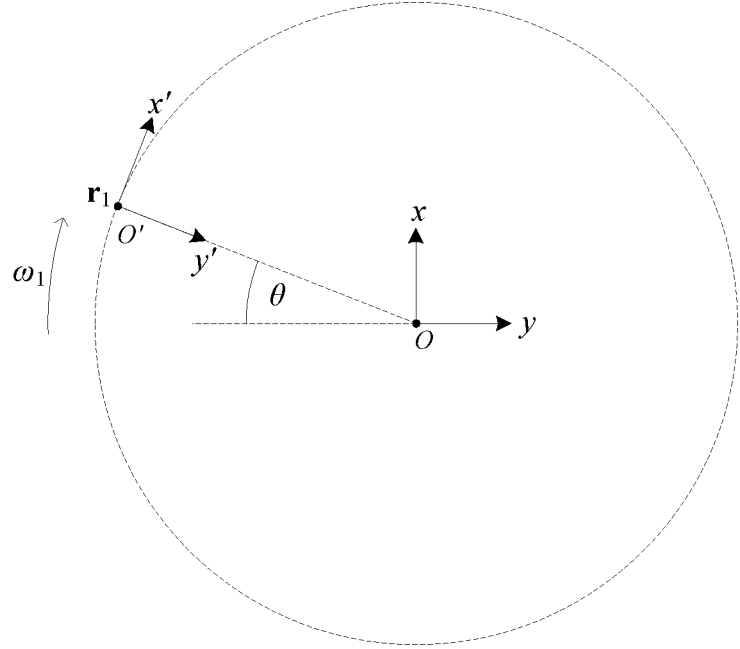
FIG. 2B is a plan view of the trajectory of FIG. 2A.
Figure 2C:
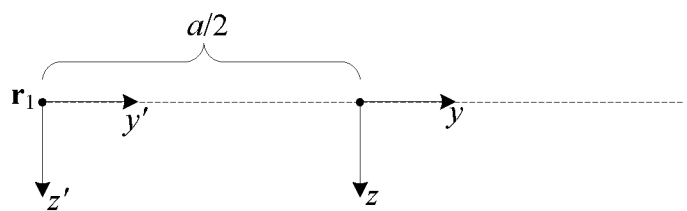
FIG. 2C is a side view of the trajectory of FIG. 2A.
Figure 3A:
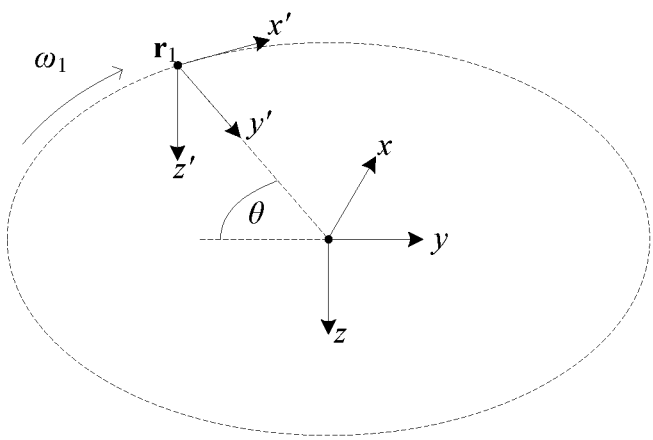
FIG. 3A is a perspective view of a sensor trajectory of a sensor moving with respect to a first reference frame X of an instrument according to some embodiments, the sensor orbits an origin of the first reference frame X with a second reference frame X'.
Figure 3D:
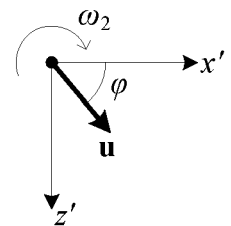
FIG. 3D is a orthogonal view of the x'z'-plane of the second reference frame X' of FIG. 3A showing the rotation of a sensitive axis u of the sensor about the y'-axis.
Figure 3B:
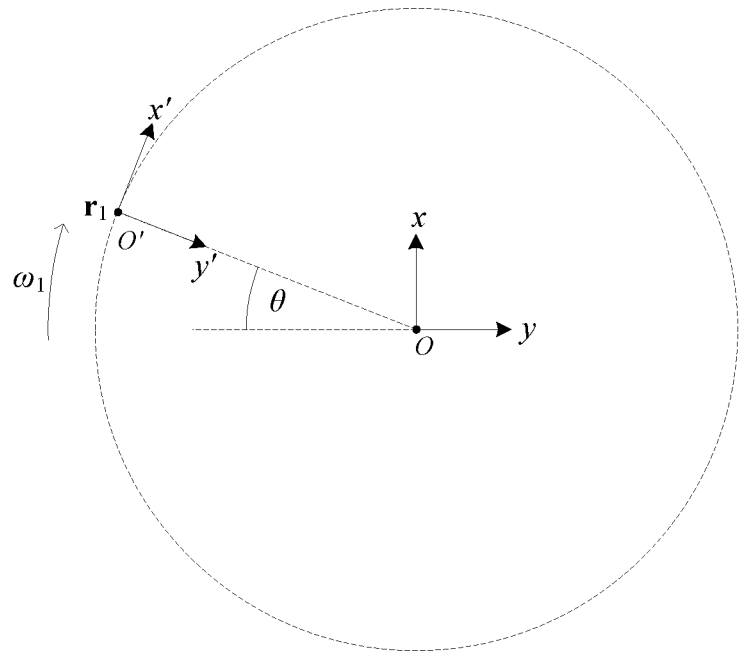
FIG. 3B is a plan view of the trajectory of FIG. 3A.
Figure 3C:
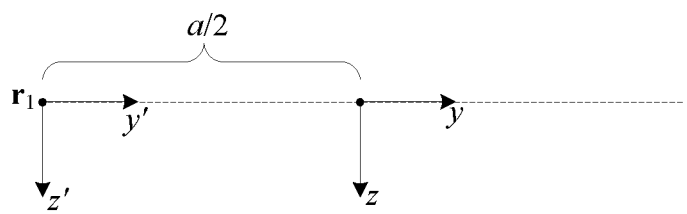
FIG. 3C is a side view of the trajectory of FIG. 3A.
Figure 4A:
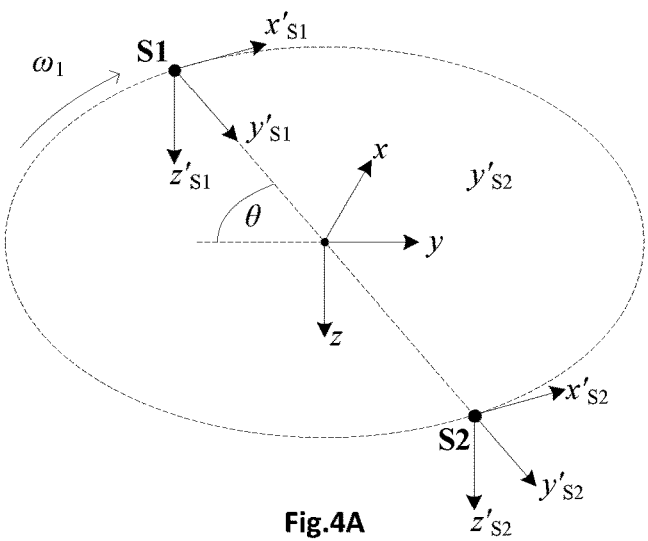
FIG. 4A is a perspective view of a dual sensor configuration according to some embodiments, each sensor S1 and S2 following a similar trajectory to the trajectory of FIG. 3A.
Figure 4B:
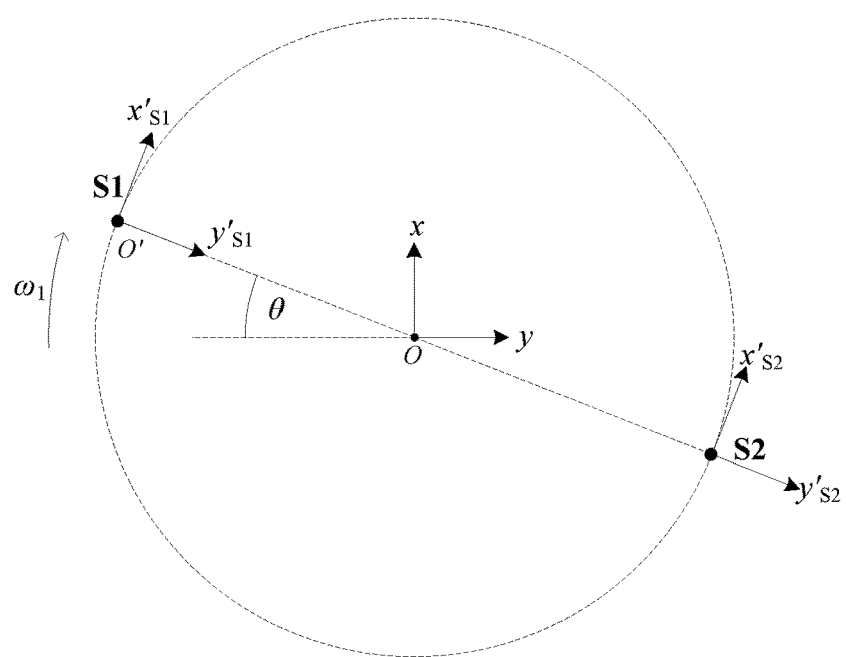
FIG. 4B is a plan view of the configuration of FIG. 4A.
Figure 4C:
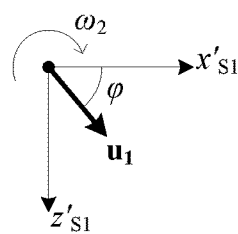
FIG. 4C is an orthogonal view of the x'z'-plane of the X'$_{S1}$-frame of FIG. 4A showing the rotation of a sensitive axis u$_1$ of the sensor S1 about the y'$_{S1}$-axis.
Figure 4D:
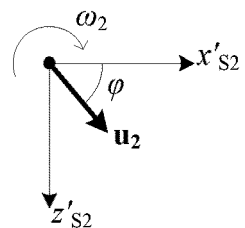
FIG. 4D is an orthogonal view of the x'z'-plane of the X'$_{S2}$-frame of FIG. 4A showing the rotation of a sensitive axis u$_2$ of the sensor S2 about the y'$_{S2}$-axis.
Figure 5A:
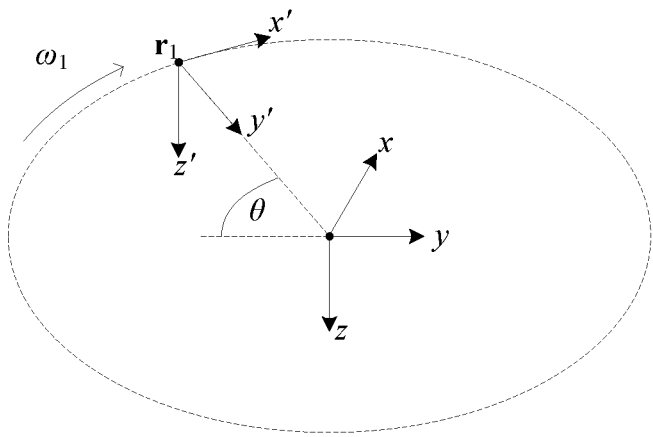
FIG. 5A is a perspective view of a sensor trajectory of a sensor moving with respect to a first reference frame X of an instrument according to some embodiments, the sensor orbits an origin of the first reference frame X with a second reference frame X'.
Figure 5D:
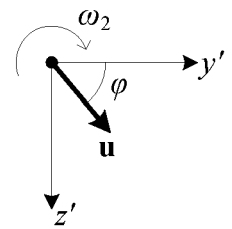
FIG. 5D is a orthogonal view of the z'y'-plane of the second reference frame X' of FIG. 5A showing the rotation of a sensitive axis u of the sensor about the x'-axis.
Figure 5B:
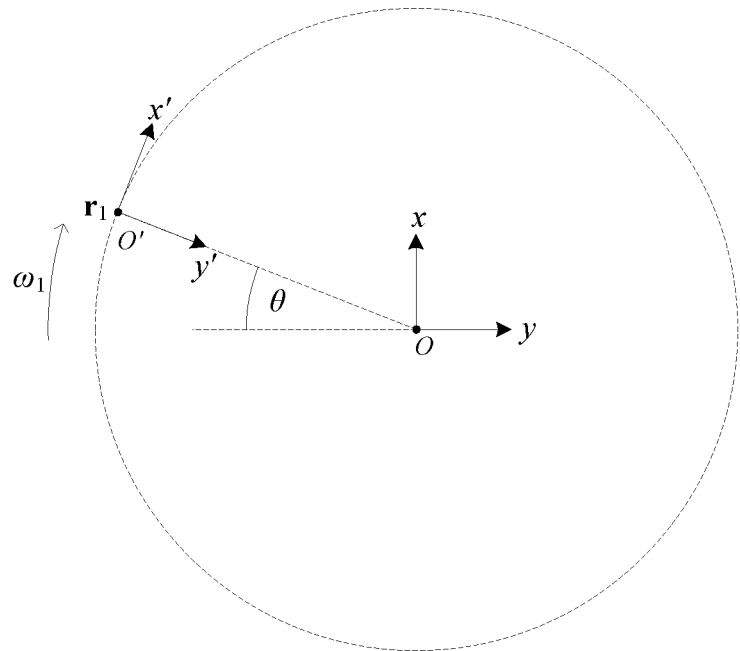
FIG. 5B is a plan view of the trajectory of FIG. 5A.
Figure 5C:
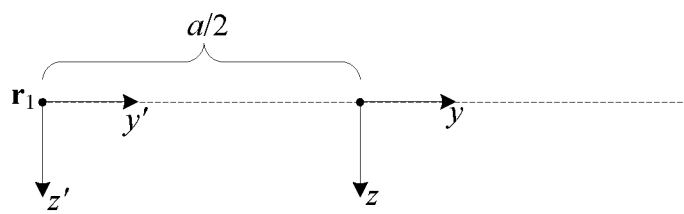
FIG. 5C is a side view of the trajectory of FIG. 5A.
Figure 7A:
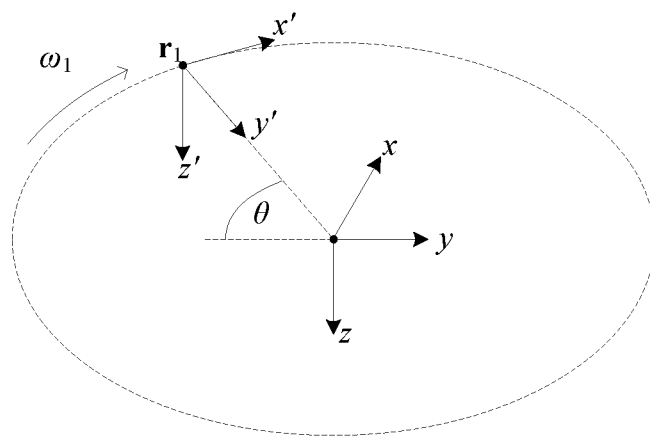
FIG. 7A is a perspective view of a sensor trajectory of a sensor moving with respect to a first reference frame X of an instrument according to some embodiments, the sensor orbits an origin of the first reference frame X with a second reference frame X'.
Figure 7D:
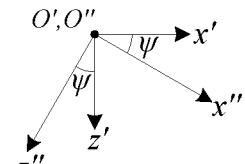
FIG. 7D is an orthogonal view of the x'z'-plane of FIG. 7A showing the relative inclination of a third reference frame X" with respect to the second reference frame X'.
Figure 7E:
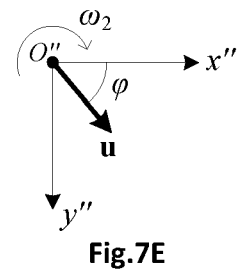
FIG. 7E is an orthogonal view of the x"y"-plane of the third reference frame X" of FIG. 7D showing the rotation of a sensitive axis u of the sensor about the z"-axis.
Figure 7B:
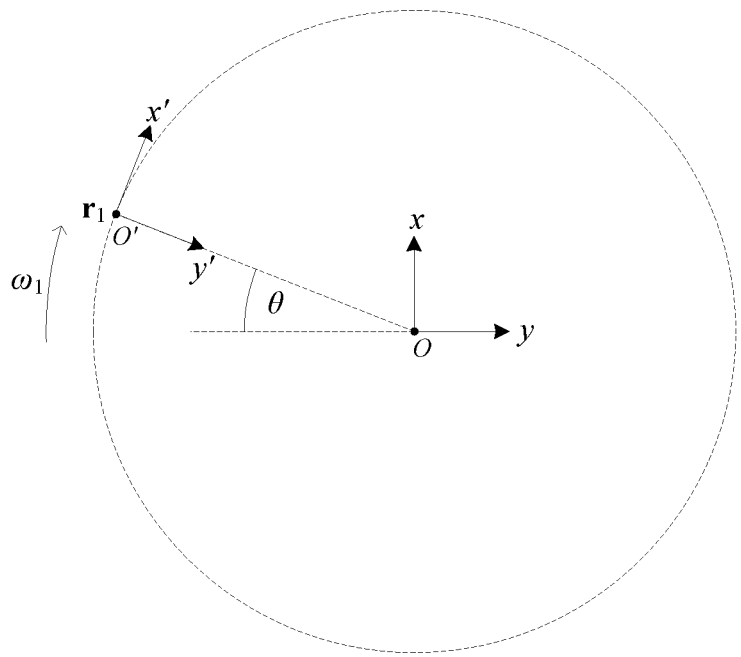
FIG. 7B is a plan view of the trajectory of FIG. 7A.
Figure 7C:
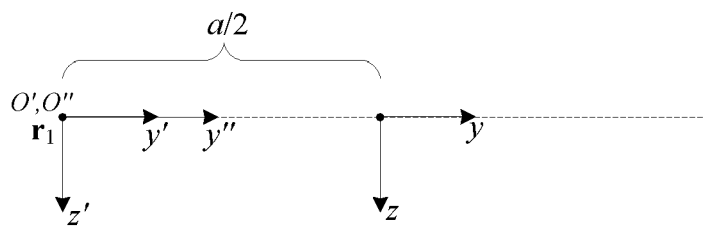
FIG. 7C is a side view of the trajectory of FIG. 7A.
Figure 10A:
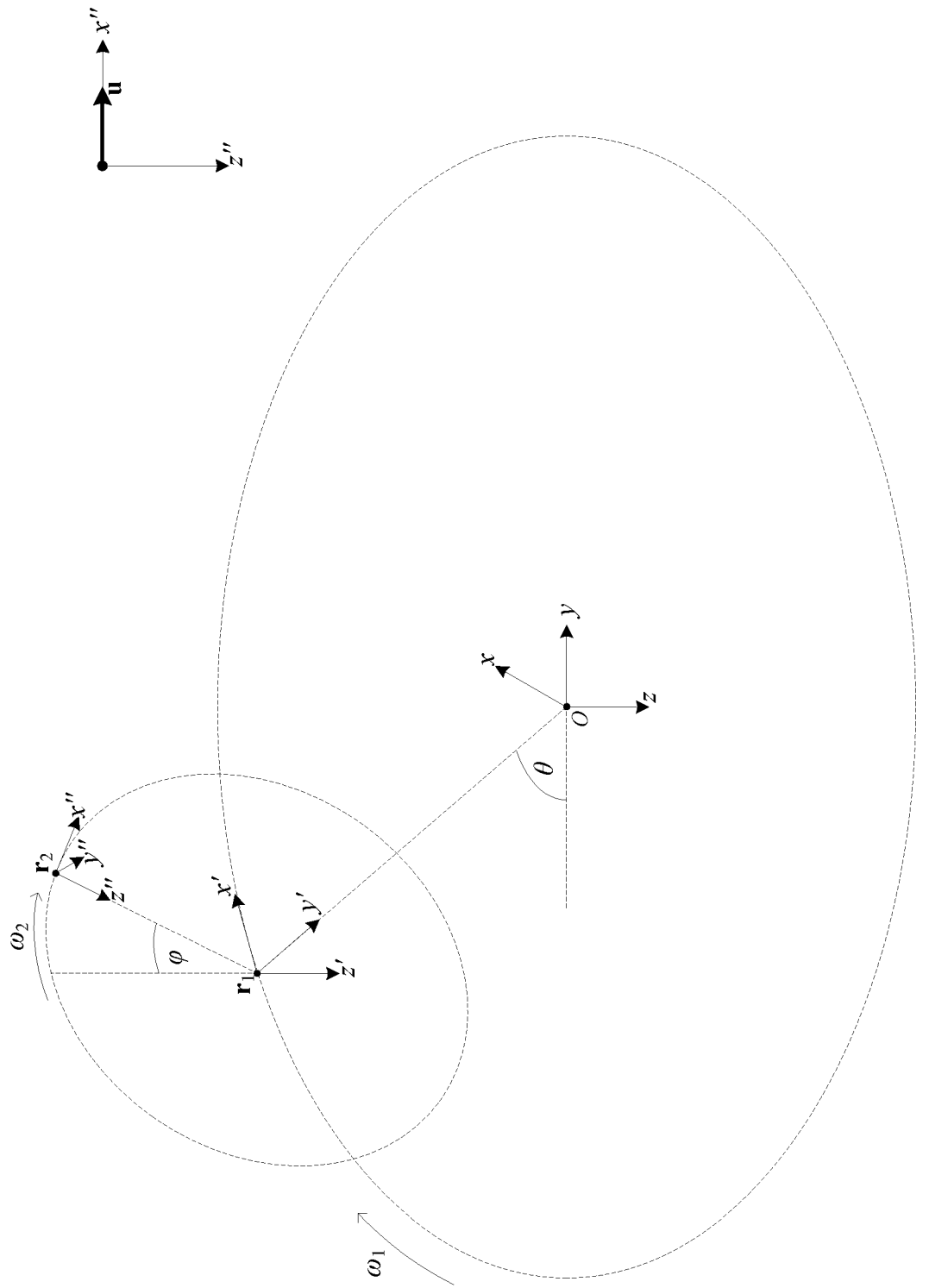
FIG. 10A is a perspective view of a sensor trajectory of a sensor moving with respect to a first reference frame X of an instrument according to some embodiments, a second reference frame X' orbits an origin of the first reference frame X, and a third reference frame X" orbits an origin of the second reference frame X' in a plane of rotation which is tangential to the trajectory of the second reference frame X.
Figure 10B:
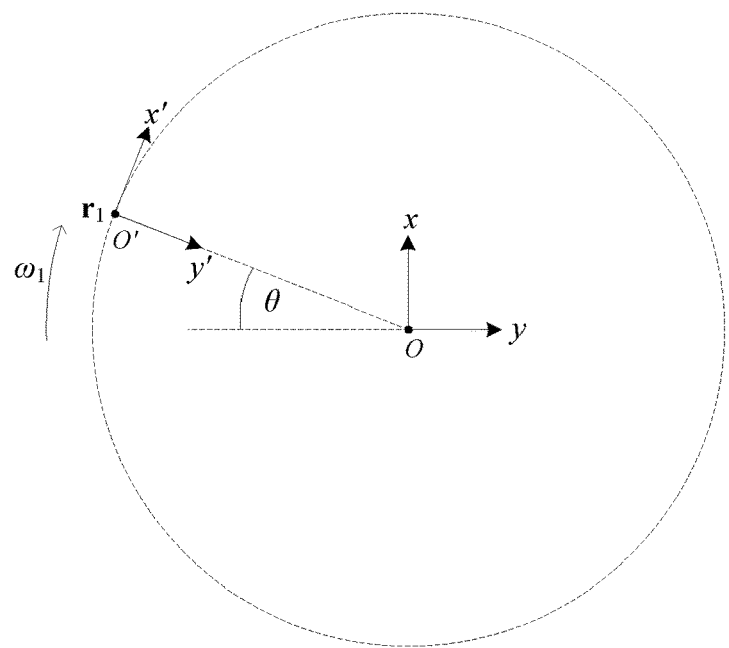
FIG. 10B is a plan view of the trajectory of FIG. 10A.
Figure 10C:
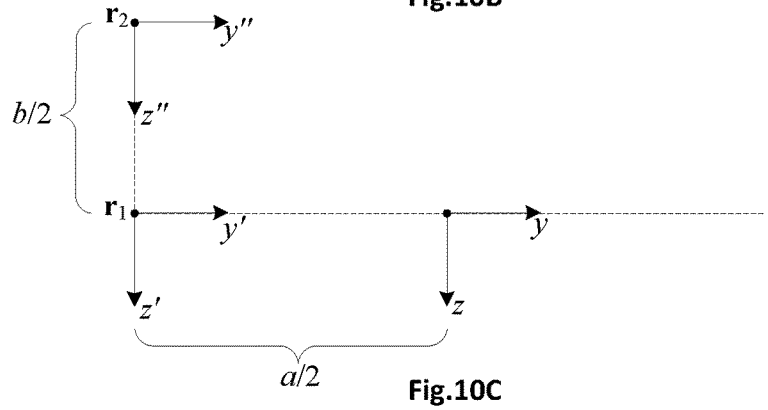
FIG. 10C is a side view of the trajectory of FIG. 10A.
Figure 10D:
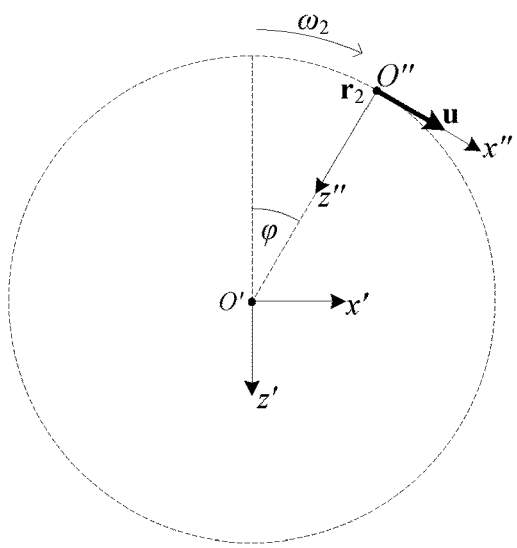
FIG. 10D is an orthogonal view of the z'x'-plane of FIG. 10A showing the relative motion of the third reference frame X" with respect to the second reference frame X'.

Embodiments generally relate to measuring instruments, systems and methods, and in particular to magnetic gradiometers.

Magnetic field sensors are of two general types. Uniaxial or directional type sensors can measure a single magnetic field component along a sensitive axis of the sensor. This type includes fluxgate magnetometers, superconducting quantum interference devices (SQUIDs), Hall effect magnetometers and various magnetoresistive devices, for example. Another type of sensor, known as a scalar or total field magnetometer, measures the total magnitude of the magnetic field vector or field strength.

The gradient of a particular magnetic field component can be determined by subtracting measurements from two magnetic field sensors that are separated by a baseline. If the distance to the nearest magnetic source is substantially greater than the baseline between the sensors of the gradiometer, the difference in the measured magnetic field, divided by the baseline, is approximately equal to the magnetic field gradient in a direction of the baseline. Arrays of magnetic field sensors in suitable configurations can be used to define gradients of multiple magnetic field components along multiple directions.

Some sensors can be designed as intrinsic gradiometers, with outputs that are proportional to the difference in a magnetic field component across a small baseline distance.

For example, axial and planar intrinsic gradiometers can be constructed from pairs of suitably oriented and positioned adjacent superconducting loops, connected such that the superconducting currents induced within each loop, which are proportional to the magnetic flux through each loop, are opposed to each other. In theory, this produces cancellation of the signal in a uniform field, and a signal proportional to the gradient in a non-uniform field, which can be read using a SQUID sensor. Higher order gradients can be measured by more complex arrangements of superconducting pickup loops.

The nine elements of the magnetic gradient tensor G consist of gradients of all three orthogonal vector field components along all three corresponding spatial directions. For example the spatial derivative along the x axis of the y component of the field vector is the gradient tensor element $G_{xy}$. The gradient tensor G is traceless ($G_{xx}+G_{yy}+G_{zz}=0$). Additionally, in a non-conducting medium, such as air, Maxwell's equations imply that the gradient tensor associated with a quasistatic magnetic field is symmetric ($G_{yx}=G_{xy}$). In this case, the gradient tensor has only five independent elements. Measurement of the full gradient tensor at a single location therefore provides five independent pieces of information about the structure of the magnetic field at that point, whereas the magnetic field vector $B=(B_x, B_y, B_z)$ provides three pieces of information and the total field $T=(B_x^2+B_y^2+B_z^2)^{1/2}$ provides only a single piece of information. As a result measurements of the gradient tensor at a limited number of locations may provide improved localisation of magnetic sources and better characterisation of their magnetic properties, compared to measurements of only the magnetic field vector or the total field.

Measurements of the magnetic field vector made on a moving platform may be adversely affected by motion noise, as small changes in orientation of the platform as it moves through the geomagnetic field, which is generally much larger than the small field variations of interest, produce variations in the measured field components that are comparable to, or even much larger than, the signal from the magnetic source targets of interest. Motion noise is much less significant for magnetic gradient measurements, because the background gradient of the geomagnetic field is relatively small compared to the gradients due to local target sources. This is one advantage of gradient measurements over vector field measurements.

One difficulty in determining the magnetic gradient tensor using an array of vector magnetic sensors is that small differences in calibration constants and slight misalignment of sensitive axes of sensors imply that a gradiometer array in practice measures a combination of the field (the common-mode signal) and its gradient. Overcoming this problem requires careful calibration, which may have to be repeated frequently, and independent measurement of the field by a separate referencing magnetometer.

Subtracting the outputs of a pair of suitably calibrated parallel uniaxial magnetometers, mounted side-by-side on a rotating disc, can provide the off-diagonal gradient tensor element $G_{x'y'}$, where x' is the instantaneous sensitive axis and y' lies along the baseline joining the centres of the two magnetometers. When such a gradiometer rotates in a field with a uniform gradient, the sum of the magnetometer outputs will vary sinusoidally with rotation angle, with the amplitude being proportional to the field component $\bar{B}=(\bar{B}_x, \bar{B}_y)$ in the plane of the disc, averaged over the disc. The same type of signal at the fundamental rotation frequency results from the residual subtracted output from imperfectly balanced sensors (i.e. the common mode signal). With respect to a fixed direction x in the rotation plane, the in-phase component of the fundamental harmonic is proportional to the x component of the field and the quadrature signal is proportional to the y component. The second harmonic component of the subtracted outputs comprises an in-phase component proportional to $G_{xy}$ and a quadrature component proportional to $(G_{xx}-G_{yy})$.

One approach to overcoming this difficulty is to rotate a gradiometer in the field to be measured, which can average out the common mode signal, in principle leaving a pure gradient signal. However, a serious problem with a rotating dual sensor gradiometer is caused by interaction between the sensors. For example for fluxgate sensors, interactions include both inductive coupling at the excitation frequency and its harmonics, and magnetostatic anomalies arising from each ferromagnetic core that perturb the field at the other. As the gradiometer rotates the ferromagnetic cores act as magnetic sources with highly anisotropic, and probably nonlinear, permeability, responding to a rotating applied field.

Undesirable interactions may be eliminated altogether by removing one of the sensors and analysing the signal from a single sensor as it follows a circular trajectory, which may be about the centre of a non-conducting and non-magnetic disc on which it is mounted, for example. Fourier analysis of the resulting signal can isolate signals due to the field components and gradient components to allow determination of multiple elements of the magnetic gradient tensor.

Referring to FIG. 1, a measuring instrument 100 is represented as a block diagram. The instrument 100 comprises: a sensor 110 mounted on a mechanism 120 to move the sensor 110 relative to the instrument 100, a signal processor 130 to receive a measurement signal from the sensor 110, and a power source 140 connected to the signal processor 130 and mechanism 120 to power the signal processor 110 and drive the motion of the sensor 110. The instrument 100 may further comprise: an actuator 150 coupled to the mechanism 120 to drive the mechanism 120 to move the sensor 110, a controller 160 connected to the actuator 150 to control the actuator 150, a computer processor 170 connected to the controller 160 and the signal processor 130 to monitor and control the controller 160 and the signal processor 130, and one or more angular position sensors 180 coupled to the mechanism 120 to measure the angular position and/or orientation of the sensor 110. The power source 140 may also be connected to the actuator 150, controller 160 and computer processor 170.

The mechanism 120 is adapted to move the sensor 110 in a predetermined path or trajectory relative to a fixed reference frame of the instrument 100 such that the sensor 110 measures a particular property of the local environment of the instrument 100 such as the magnetic field, for example and the signal measured along the path can then be analysed to compare the property at various points along the path to determine spatial gradients of the property in the local environment of the instrument 100. The predetermined path of the sensor 110 may be mathematically defined and known to allow comparison of the sensor signal with the predetermined path. If the predetermined path is known by a user, the user can analyse the sensor signal and compare it against the path of the sensor 110 to determine spatial gradients of the measured property. Alternatively, the predetermined path may be entered into the computer processor 170 to allow the computer processor 170 to analyse the sensor signal and compare it against the path of the sensor 110 to determine one or more characteristics of the measured property, such as spatial gradients, for example.

The predetermined path of the sensor 110 may comprise one or more rotational components having angular velocities and associated frequency components. The sensor signal may also comprise frequency components related to the predetermined path of the sensor 110. The frequency components of the sensor signal may be identified and compared with the frequency components associated with the predetermined path of the sensor 110 to determine one or more characteristics of the property of interest.

The sensor 110 may be adapted to measure various properties of the local environment of the measuring instrument 100 such as physical properties including scalar quantities such as total magnetic intensity; directional quantities such as individual components of magnetic, electric or gravitational fields; or vector quantities such as magnetic fields, electric fields, gravitational or other force fields, for example. In some embodiments, the sensor 110 may comprise multiple sensors to measure different properties simultaneously, or multiple sensors to measure the same property to allow for comparison and/or calibration.

In some embodiments, the sensor 110 may comprise a single magnetometer or magnetic field sensor and the instrument 100 may comprise a magnetic gradiometer, which may also provide measurements of magnetic field vector components. Some magnetometers which may be used are: directionally sensitive magnetometers, uniaxial magnetometers, fluxgate magnetometers, superconducting quantum interference devices (SQUIDs), Hall effect magnetometers, various magnetoresistive devices, anisotropic magnetoresistance (AMR) magnetometers, scalar magnetometers or total field magnetometers such as chip-scale atomic magnetometers, for example. The motion of the sensor 110 relative to the instrument 100 may allow multiple components of the magnetic gradient tensor to be measured in the local environment of the instrument 100, such as one, two, three, four or five independent components of the magnetic gradient tensor, for example. As well as measuring magnetic gradients, the motion of the sensor 110 relative to the instrument 100 may allow multiple components of the magnetic field vector to be measured in the local environment of the instrument 100, such as one, two, or three, independent components of the magnetic field vector, for example. The motion of the sensor 110 relative to the instrument 100 may allow multiple components of the vector gradient of the total magnetic intensity to be measured in the local environment of the instrument 100, such as one, two, or three independent components of the vector gradient of the total magnetic intensity, for example.

Some exemplary applications for the magnetic gradiometers described herein include: measurement-while-drilling (MWD) of magnetic fields and gradients in boreholes to detect external magnetic sources or to study magnetisation of rock formations; detection, localisation and classification (DLC) of magnetic targets from static or mobile platforms; downhole magnetic surveys for mineral exploration or environmental studies; mapping of magnetic field anomalies for geological interpretation, resource exploration and in environmental and archaeological surveys; detection of unexploded ordnance (UXO); and detecting or measuring other magnetic targets of interest, such as land mines, naval mines, submarines, shipwrecks, archaeological artefacts and structures, buried drums containing toxic waste, for example, and many others. Apart from their uses in systematic magnetic surveys, gradient tensor measurements have a specific application to manoeuvrable search platforms that home onto compact magnetic targets, such as buried land mines, naval mines and UXO. Other applications include fixed magnetic gradiometers that are used to track moving sources such as submarines entering a harbour, concealed handguns carried into a room, hypodermic needles within hospital laundry, or ferrous contaminants in foodstuffs moving along a conveyor belt, for example.

In embodiments where the sensor 110 comprises a directionally sensitive sensor, an axis along which the sensor 110 is most sensitive may be referred to as the sensitive axis and may be denoted by vector u.

The power source 140 may supply power to the signal processor 130, the actuator 150, the controller 160, and/or the computer 170. The power source 140 may also supply power to the sensor 110 if necessary.

The signal processor 130 may receive and process a signal measured by the sensor 110, which may be referred to as a sensor signal or a magnetometer signal in embodiments where the sensor 110 comprises a magnetometer. The signal processor 130 may then determine certain local environmental properties or physical properties based on measurements from the sensor 110. Alternatively, the signal processor 130 may process the measured signal and output a processed signal to be received and analysed by the computer 170.

Frequency components of the signal measured by the sensor 110 may be analysed by an analogue filter bank or by digital sampling. The signal may be sampled by an analogue-to-digital converter (ADC) 135, at equal increments of the rotation angle(s), as determined from a signal generated by the angular position sensor(s) 180. Alternatively, if the angular speed of the rotary motion is kept constant, the signal may be sampled at equal time intervals. The angular position sensor 180 may comprise any suitable angular position sensor such as a shaft encoder, or an optical sensor that detects fiducial marks or slots in a rotor, for example.

The digital samples of the signal measured by the sensor 110 may then be input to a discrete Fourier transform, which may be implemented either by hardware, such as by a fast Fourier transform (FFT) chip 137 which may form part of the signal processor 130, or by standard Fourier Transform software executed by the computer 170. The output of the Fourier analysis may comprise amplitudes and phases (or in-phase and quadrature components) of the discrete frequency components of the signal measured by the sensor 110, where the phase is determined relative to an output signal of the angular position sensor(s) 180.

The output of the Fourier analysis can then be compared against the trajectory of the sensor 110 to determine a number of elements of the gradient tensor as well as the directional components of the field strength if the measured field is a vector field, or a number of spatial gradients of the field intensity if the measured field is the scalar intensity. In the case of magnetic field measurement, elements of the magnetic gradient tensor may be determined where the magnetic gradient tensor is defined as:

$$G = G_{ij} = \frac{\partial B_{x_i}}{\partial x_j},$$

where B is the magnetic field, $x_i$ denotes directions (x, y, z) and $B_{xi}$ denotes the magnetic field components ($B_x$, $B_y$, $B_z$).

The output of the Fourier analysis of a signal measured by a directionally sensitive magnetometer 110 can be compared against the trajectory of the sensor 110 to determine some or all of the elements of the magnetic gradient tensor G as well as some or all of the components of the magnetic field B.

Fourier analysis of the signal measured by a directionally sensitive magnetometer 110 can be compared against the trajectory of the sensor 110 to also determine some or all of the higher order gradients of the magnetic field B from frequency components that are higher multiples of the rotation frequency. For example, second order gradients of the measured field, which are components of a third order tensor, grad(gradB), can be extracted from the third harmonic of the rotation frequency.

The actuator 150 may comprise one or more actuators such as electric motors, for example, disposed to apply one or more input forces to the mechanism 120 to drive the mechanism 120 and move the sensor 110 in the predetermined path.

The actuator 150 may be controlled by the controller 160 in order to drive the mechanism 120 in a predetermined manner to move the sensor 110 in a required direction and at a required speed. In some embodiments, the controller 160 may control the actuator 150 by controlling power supply from the power source 140 to the actuator 150.

The controller 160 may be controlled or operated by the computer 170 executing program code accessible by the computer 170 to cause the controller 160 to issue control signals to the actuator 150.

The computer 170 may also control or operate the signal processor 130, or at least receive an output signal from the signal processor 130 and analyse the output signal to determine one or more spatial gradients of the measured quantity. In embodiments where the instrument 110 comprises a magnetic gradiometer, the computer 170 may determine one or more output measurements selected from: the total magnetic intensity, an average of a component of the magnetic field strength in a direction along an x-axis of the instrument 100, an average of a component of the magnetic field strength in a direction along a y-axis of the instrument 100, an average of a component of the magnetic field strength in a direction along a z-axis of the instrument 100, the gradient of the x component in the x direction, the gradient of the y component in the y direction, the difference between the gradient of the x component in the x direction and the gradient of the y component in the y direction, the gradient of the z component in the z direction, the gradient of the x component in the y direction, the gradient of the y component in the x direction, the gradient of the y component in the z direction, the gradient of the z component in the y direction, the gradient of the x component in the z direction, and the gradient of the z component in the x direction.

The instrument may further comprise a user interface 175 for a user to control the computer 170 and receive output measurements determined by the computer 170. The user interface 175 may comprise a display to display the one or more output measurements determined by the computer 170.

In some embodiments, the computer 170 and/or signal processor 160 may be remote from the sensor 110 and mechanism 120. In some embodiments, the measured signal may be recorded and stored on a memory (not shown) for later analysis by a computer 170.

The mechanism 120 may cause the sensor 110 to move relative to the fixed reference frame of the instrument 100 in any suitable path that can be input into the computer 170 to allow the computer 170 to determine the one or more output measurements based on the measured or processed signal and the trajectory of the sensor 110.

Some exemplary sensor trajectories are shown in FIGS. 2A to 10D according to some embodiments. Equations are presented for the value of a quantity $B_u$ measured by a uniaxial sensor 110 with sensitive axis u (such as a uniaxial magnetic sensor, for example) moving through a vector field B (such as a magnetic field, for example) along the various trajectories presented in each of FIGS. 2A to 10D. Each of the trajectories described below include one or two rotation components with first and second associated angular velocities $\omega_1$ and $\omega_2$. In some embodiments, the angular velocity $\omega_1$ may be constant or uniform. In other embodiments, the angular velocity $\omega_1$ may be variable with time. In some embodiments, the angular velocity $\omega_2$ may be constant or uniform. In other embodiments, the angular velocity $\omega_2$ may be variable with time.

If an angular velocity is constant or uniform, the sensor signal can be sampled at equal time intervals and the frequency components of the signal will correspond to the temporal frequency of the angular velocity. The frequency components can then be identified through Fourier analysis, for example, where the Fourier components correspond to the temporal frequency components.

If an angular velocity is variable and not uniform, the sensor signal can be sampled at equal angular increments of the rotations, rather than at equal time intervals. In these cases, the Fourier components represent cycles per rotation, rather than angular frequencies in units such as rad/s or frequencies in Hz. Throughout this document the term "frequency component" represents a component of a sensor signal, or a component associated with a predetermined path or trajectory, defined in cycles per rotation. The frequency components of a sensor signal may be isolated by Fourier analysis of the sensor signal, which is readily converted into units of rad/s or Hz if the rotation rates are uniform.

FIGS. 2A to 2D show a circular sensor trajectory with the sensitive axis u directed tangentially to the trajectory. A first fixed reference frame X of the instrument 100 is shown as orthogonal coordinate axes X=(x,y,z) having an origin O at the centre. A second orbiting reference frame X'=(x',y',z') rotates about the origin O with an origin O' of the reference frame X' following a circular trajectory described by $r_1$ at a distance $|r_1|=a/2$ from the origin O.

Reference frame X' rotates such that: x' is directed in the direction of motion of X' tangential to the trajectory of X; y' is directed radially inward towards O; and z' remains parallel to and spaced from z. The angular velocity of X' orbiting O is denoted by $\omega_1$, and the angle of rotation θ is defined as the angle between x and x' (θ=0 when x' is parallel to x, θ is defined as positive as measured from x towards y, and θ=$\omega_1$t, where t=time, for the case of uniform rotational motion). In some embodiments, the angular velocity $\omega_1$ may be constant. In other embodiments, the angular velocity $\omega_1$ may not be constant.

The sensor 110 is located at O' and the direction of the sensitive axis u fixed relative to X'. In various embodiments, the sensitive axis u may be directed in any desired direction with respect to X'; however, in FIGS. 2A to 2D, the sensitive axis u is aligned with x'.

$$r_1=(x,y), \text{ where } x=(a/2)\sin θ, y=-(a/2)\cos θ. \tag{1}$$

Assuming a uniform field gradient, the field vector in the plane of rotation at this location is given by $$B(x, y) = B(0, 0) + G \cdot r \tag{2}$$
$$= \bar{B} + (a/2)(G_{xx}\sin θ - G_{xy}\cos θ)\hat{x} +$$
$$(a/2)(G_{xy}\sin θ - G_{yy}\cos θ)\hat{y}$$

where $\bar{\mathbf{B}}=(\bar{B}_x, \bar{B}_y)$ is the field component in the xy-plane averaged over the sensor trajectory. In equation (2), and throughout this document, unit vectors are denoted by hats above bold symbols that denote vector quantities.

The component of this field B measured by the sensor is $$B_u = B_x \cos\theta + B_y \sin\theta \quad (3)$$
$$= \bar{B}_x \cos\theta + \bar{B}_y \sin\theta - (a/2)G_{xy}(\cos^2\theta - \sin^2\theta) +$$
$$(a/2)(G_{xx} - G_{yy})\sin\theta\cos\theta$$
$$= \bar{B}_x \cos\theta + \bar{B}_y \sin\theta - (a/2)G_{xy}\cos 2\theta +$$
$$(a/4)(G_{xx} - G_{yy})\sin 2\theta.$$

Equation (3) shows that, as the sensor 110 orbits the origin O, the in-phase and quadrature signals at the fundamental rotation rate are proportional to the x and y field components at the origin O respectively, and the in-phase and quadrature components of the second harmonic signal are, respectively, proportional to $G_{xy}$ and $(G_{xx}-G_{yy})$, which are mathematically the two independent components of the differential curvature of the magnetic scalar potential.

One advantage of a magnetic gradiometer with a single magnetic sensor 110 is that only one calibration constant is required to convert the signal measured by the sensor 110 (in volts, for example) into field and gradient components in nT and nT/m respectively (or any other suitable units for magnetic strength). Measurements about three suitably oriented rotation axes should provide sufficient information to calculate the full magnetic field vector and magnetic gradient tensor.

The single fixed orbiting uniaxial magnetometer may also provide an advantage due to its simplicity, and may provide a clean separation of field and gradient components in the frequency domain. Separation of field and gradient signals into different frequency bins greatly reduces contamination of the gradient signal by misalignment of the sensitive axes of multiple sensors and by vibration.

On the other hand, a single sensor system only gives partial information about the gradient tensor, so complete determination of the magnetic gradient tensor in a downhole survey requires three such systems with rotation axes that are oblique to the drilling axis, or a single obliquely oriented system for which the rotation axis precesses about the drilling axis (or instrument z-axis).

In some embodiments, the uniaxial magnetometer may be supplemented by magnetometers with sensitive axes aligned parallel to y' (radially inward), and z' (to form an orthogonal right-handed system). As the magnetometer orbits the instrument z axis, the signal from the tangential sensor is given by (3) and the signals from the other two sensors are given by:

$$B_{y'} = -B_x \sin\theta + B_y \cos\theta \quad (8)$$
$$= -\bar{B}_x \sin\theta + \bar{B}_y \cos\theta - (a/2)(G_{xx}\sin^2\theta - G_{yy}\cos^2\theta - G_{xy}\sin\theta\cos\theta)$$
$$= \frac{-(G_{xx}+G_{yy})a}{4} - \bar{B}_x \sin\theta + \bar{B}_y \cos\theta + \frac{(G_{xx}-G_{yy})a}{4}\cos 2\theta +$$
$$(G_{xy}a/2)\sin 2\theta$$
$$= \frac{G_{zz}a}{4} - \bar{B}_x \sin\theta + \bar{B}_y \cos\theta + \frac{(G_{xx}-G_{yy})a}{4}\cos 2\theta + (G_{xy}a/2)\sin 2\theta.$$

and $$B_z(x, y) = B_z(0, 0) + \frac{\partial B_z}{\partial x} + \frac{\partial B_z}{\partial y}y = \bar{B}_z + (G_{xz}a/2)\sin\theta - (G_{yz}a/2)\cos\theta. \quad (9)$$

Comparing (8) with (3), it is clear that the measured radial component supplies equivalent information to the tangential component, supplemented by a DC term that is proportional to $G_{zz}=(G_{xx}+G_{yy})$. In principle, knowledge of the sum and difference of $G_{xx}$ and $G_{yy}$, from the DC and in-phase second harmonic terms respectively, then allows determination of all of the diagonal components of the gradient tensor. However, any unknown offset in the sensor will contaminate the DC term and introduce errors into the calculated gradients. In practice, the choice between tangential or radial orientation of a single orbiting sensor will usually be determined by convenience of layout or manufacture.

From (9) the z component augments the other two components with information about $B_z$, $G_{xz}$ and $G_{yz}$. The tangential and radial components each define the quantity $G_{xx}-G_{yy}$, but do not provide enough information to determine the diagonal components of the tensor uniquely.

If two orbiting triaxial (or biaxial x'z' or y'z') magnetometer systems are mounted along the instrument z axis, separated by a baseline $z_0$, then the field vector and gradient tensor midway between these two sensors are given by:

$$\bar{B}_x(z) = \frac{\bar{B}_x(z-z_0/2) + \bar{B}_x(z+z_0/2)}{2}, \quad (10)$$
$$\bar{B}_y(z) = \frac{\bar{B}_y(z-z_0/2) + \bar{B}_y(z+z_0/2)}{2},$$
$$\bar{B}_z(z) = \frac{\bar{B}_z(z-z_0/2) + \bar{B}_z(z+z_0/2)}{2},$$
$$G_{xy}(z) = \frac{G_{xy}(z-z_0/2) + G_{xy}(z+z_0/2)}{2},$$
$$G_{xz}(z) = \frac{G_{xz}(z-z_0/2) + G_{xz}(z+z_0/2)}{2} \approx \frac{\bar{B}_x(z+z_0/2) - \bar{B}_x(z-z_0/2)}{z_0},$$
$$G_{yz}(z) = \frac{G_{yz}(z-z_0/2) + G_{yz}(z+z_0/2)}{2} \approx \frac{\bar{B}_y(z+z_0/2) - \bar{B}_y(z-z_0/2)}{z_0},$$
$$G_{zz} = -(G_{xx}+G_{yy}) = \frac{\bar{B}_z(z+z_0/2) - \bar{B}_z(z-z_0/2)}{z_0},$$

Since $G_{xx}-G_{yy}$ is given by (3) or (8) and $G_{xx}+G_{yy}$ is given by (10), the diagonal components $G_{xx}$ and $G_{yy}$ can be calculated individually, yielding the complete gradient tensor G.

Comparison of the frequency content of the signals given in (3), (8) and (10) shows that any misalignment of the sensor z axis with the axis of orbital motion will contaminate the estimates of $G_{xz}$ and $G_{yz}$ due to contributions at the fundamental frequency from $B_x$ and $B_y$. Because the field is so large relative to the changes in field components across the baseline, a small misalignment can lead to large errors in estimating these gradient components. It may therefore be preferable to estimate these tensor components from the differences of $B_x$ and $B_y$ measured along a finite baseline parallel to z, as in the expressions on the far right-hand side of equation (10).

In some embodiments, the sensor 110 may comprise a total magnetic intensity sensor such as a compact scalar magnetometer, for example. The total magnetic intensity (TMI) T at the location of a sensor 110 orbiting the instrument z-axis in a circular trajectory is:

$$T(x, y) = T(0, 0) + \nabla T \cdot r = \quad (11)$$
$$\overline{T} + \frac{\partial T}{\partial x}x + \frac{\partial T}{\partial y}y = \overline{T} + (a/2)\left(\frac{\partial T}{\partial x}\sin\theta - \frac{\partial T}{\partial y}\cos\theta\right).$$

A DC component of the signal gives the TMI at the centre of the orbit (origin O) and the amplitude and phase of the signal at the orbital frequency yield the orthogonal gradients of the TMI within the xy-plane. If a second TMI sensor is placed directly antipodal to the first TMI sensor, at $(x,y)=(a/2)(-\sin\theta, \cos\theta)$, then the DC term in equation (11) is unchanged, but the in-phase and quadrature components at the rotation rate change sign. This means that the average signal from the two sensors is the TMI at the centre of the orbit and the subtracted signal (first sensor signal minus the second sensor signal) reflects only the gradients, with $\partial T/\partial x=(1/a)(Q_1-Q_2)$ and $\partial T/\partial y=(1/a)(I_2-I_1)$, where the subscripts refer to the signals from the first and second sensors S1 and S2 respectively.

If two such orbiting TMI sensors are mounted along the instrument z axis, separated by a baseline $z_0$, then the TMI, its vector gradient, and a pair of second order gradients at the midway point along the orbital axis are given by:

$$\overline{T}(z) = \frac{\overline{T}(z-z_0/2) + \overline{T}(z+z_0/2)}{2}, \quad (12)$$
$$\frac{\partial \overline{T}}{\partial x}(z) = \frac{1}{2}\left[\frac{\partial \overline{T}}{\partial x}(z-z_0/2) + \frac{\partial \overline{T}}{\partial x}(z+z_0/2)\right],$$
$$\frac{\partial \overline{T}}{\partial y}(z) = \frac{1}{2}\left[\frac{\partial \overline{T}}{\partial y}(z-z_0/2) + \frac{\partial \overline{T}}{\partial y}(z+z_0/2)\right],$$
$$\frac{\partial \overline{T}}{\partial z}(z) = \frac{\overline{T}(z+z_0/2) + \overline{T}(z-z_0/2)}{z_0},$$
$$\frac{\partial^2 \overline{T}}{\partial x \partial z}(z) = \frac{1}{z_0}\left[\frac{\partial \overline{T}}{\partial x}(z+z_0/2) - \frac{\partial \overline{T}}{\partial x}(z-z_0/2)\right],$$
$$\frac{\partial^2 \overline{T}}{\partial y \partial z}(z) = \frac{1}{z_0}\left[\frac{\partial \overline{T}}{\partial y}(z+z_0/2) - \frac{\partial \overline{T}}{\partial y}(z-z_0/2)\right].$$

The sensor trajectory shown in FIGS. 3A to 3D is the same as the trajectory shown in FIGS. 2A to 2D, however the sensitive axis u is rotating with respect to X'. The sensitive axis u rotates in the x'z'-plane about y' (and perpendicular to y') with angular velocity $\omega_2$ and rotation angle $\varphi$ ($\varphi=0$ when u is parallel to x', $\varphi$ is defined as positive as measured between x' and u from x' towards z', and $\varphi=\omega_2 t$, where t=time, for the case of uniform rotational motion). In some embodiments, the angular velocity $\omega_2$ may be constant. In other embodiments, the angular velocity $\omega_2$ may not be constant.

The field component measured by the sensor 110 is given by:

$$B_u = B_{x'}\cos\varphi + B_{z'}\sin\varphi \quad (13)$$

Using (2) and (3), in terms of the field and gradient components with respect to the instrument the measured field is therefore $$B_u = [\overline{B}_x\cos\theta + \overline{B}_y\sin\theta - (a/2)G_{xy}\cos2\theta + (a/4)(G_{xx} - G_{yy})\sin2\theta]\cos\varphi +$$
$$\overline{B}_z\sin\varphi + (a/2)G_{xz}\sin\theta\sin\varphi - (a/2)G_{yz}\cos\theta\sin\varphi] =$$
$$\frac{\overline{B}_x}{2}[\cos(\theta-\varphi) + \cos(\theta+\varphi)] + \frac{\overline{B}_y}{2}[\sin(\theta-\varphi) + \sin(\theta+\varphi)] +$$
$$\overline{B}_z\sin\varphi + \frac{a}{2}\left\{-\frac{G_{xy}}{2}[\cos(2\theta-\varphi) + \cos(2\theta+\varphi)] + \right.$$
$$\frac{(G_{xx} - G_{yy})}{4}[\sin(2\theta-\varphi) + \sin(2\theta+\varphi)] +$$
$$\left. \frac{G_{xz}}{2}[\cos(\theta-\varphi) - \cos(\theta+\varphi)] + \frac{G_{yz}}{2}[\sin(\theta-\varphi) - \sin(\theta+\varphi)]\right\}$$

In terms of the rotation frequencies the measured field is therefore $$B_u = [\overline{B}_x\cos\omega_1 t + \overline{B}_y\sin\omega_1 t - (a/2)G_{xy}\cos2\omega_1 t + (a/4)(G_{xx} - G_{yy})\sin2\theta]$$
$$\cos\varphi + \overline{B}_z\sin\varphi + (a/2)G_{xz}\sin\theta\sin\varphi - (a/2)G_{yz}\cos\theta\sin\varphi] =$$
$$\frac{\overline{B}_x}{2}[\cos(\omega_1 - \omega_2)t + \cos(\omega_1 + \omega_2)] + \frac{\overline{B}_y}{2}[\sin(\omega_1 - \omega_2)t + \sin(\omega_1 + \omega_2)] +$$
$$\overline{B}_z\sin\omega_2 t + \frac{a}{2}\left\{-\frac{G_{xy}}{2}[\cos(2\omega_1 - \omega_2)t + \cos(2\omega_1 + \omega_2)t] + \right.$$
$$\frac{(G_{xx} - G_{yy})}{4}[\sin(2\omega_1 - \omega_2)t + \sin(2\omega_1 + \omega_2)t] +$$
$$\frac{G_{xz}}{2}[\cos(\omega_1 - \omega_2)t - \cos(\omega_1 + \omega_2)t] +$$
$$\left. \frac{G_{yz}}{2}[\sin(\omega_1 - \omega_2)t - \sin(\omega_1 + \omega_2)t]\right\}$$

Collecting terms and simplifying gives an expression for the Fourier components in terms of field and gradient components $$B_u = \left(\frac{\overline{B}_x}{2} + \frac{G_{xz}a}{4}\right)\left[\cos(\omega_1 - \omega_2)t + \left(\frac{\overline{B}_x}{2} - \frac{G_{xz}a}{4}\right)\cos(\omega_1 + \omega_2)t\right] + \quad (14)$$
$$\left(\frac{\overline{B}_y}{2} + \frac{G_{yz}a}{4}\right)\left[\sin(\omega_1 - \omega_2)t + \left(\frac{\overline{B}_y}{2} - \frac{G_{yz}a}{4}\right)\sin(\omega_1 + \omega_2)t\right] +$$
$$\overline{B}_z\sin\omega_2 t - \frac{G_{xy}a}{4}\cos(2\omega_1 - \omega_2)t + \frac{G_{xy}a}{4}\cos(2\omega_1 + \omega_2)t +$$
$$\frac{(G_{xx} - G_{yy})a}{8}\sin(2\omega_1 - \omega_2)t + \frac{(G_{xx} - G_{yy})a}{8}\sin(2\omega_1 + \omega_2)t$$

It follows from (9) that all three components of the field vector, all three off-diagonal components of the gradient tensor and the difference between the two diagonal tensor components in the plane of rotation are given by $$\overline{B}_x = I(\omega_1 - \omega_2) + I(\omega_1 + \omega_2), \quad (15)$$
$$\overline{B}_y = Q(\omega_1 - \omega_2) + Q(\omega_1 + \omega_2), \overline{B}_z = Q(\omega_2),$$
$$G_{xy} = \frac{2[I(2\omega_1 + \omega_2) - I(2\omega_1 - \omega_2)]}{a},$$
$$G_{xz} = \frac{2[I(\omega_1 - \omega_2) - I(\omega_1 + \omega_2)]}{2},$$
$$G_{yz} = \frac{2[Q(\omega_1 - \omega_2) - Q(\omega_1 + \omega_2)]}{a},$$

-continued
$$G_{xx} - G_{yy} = \frac{4[Q(2\omega_1 - \omega_2) + Q(2\omega_1 + \omega_2)]}{2},$$

where $I(\omega)$, $Q(\omega)$ denote calibrated in-phase and quadrature Fourier components at angular frequency $\omega$.

If two of these rotating, orbiting magnetometer systems are mounted along the instrument z axis, separated by a baseline $z_0$, then the field vector and gradient tensor midway between these two sensors are given by $$\overline{B}_x(z) = \frac{\overline{B}_x(z - z_0/2) + \overline{B}_x(z + z_0/2)}{2},\quad(16)$$

$$\overline{B}_y(z) = \frac{\overline{B}_y(z - z_0/2) + \overline{B}_y(z + z_0/2)}{2},$$

$$\overline{B}_x(z) = \frac{\overline{B}_z(z - z_0/2) + \overline{B}_z(z + z_0/2)}{2},$$

$$G_{xy}(z) = \frac{G_{xy}(z - z_0/2) + G_{xy}(z + z_0/2)}{2},\quad(17)$$

$$G_{xz}(z) = \frac{G_{xz}(z - z_0/2) + G_{xz}(z + z_0/2)}{2} = \frac{\overline{B}_x(z + z_0/2) - \overline{B}_x(z - z_0/2)}{2},$$

$$G_{yz}(z) = \frac{G_{yz}(z - z_0/2) + G_{yz}(z + z_0/2)}{2} =$$

$$\frac{\overline{B}_y(z + z_0/2) - \overline{B}_y(z - z_0/2)}{2},$$

$$G_{zz} = -(G_{xx} + G_{yy}) = \frac{\overline{B}_z(z + z_0/2) - \overline{B}_z(z - z_0/2)}{z_0},$$

Since $G_{xx}-G_{yy}$ and $G_{xx}+G_{yy}$ are given by (15) and (17) respectively, the diagonal components $G_{xx}$ and $G_{yy}$ can be calculated individually, yielding the complete gradient tensor. Frequency domain separation yields reliable estimates of $G_{xy}$ and $G_{xx}-G_{yy}$, but estimates of $G_{xz}$ and $G_{yz}$ require accurate estimates of $B_x$ and $B_y$, which are adversely affected by misalignment of sensor axes, because the signals of these gradient components have the same frequency as the field components. However, the vector components derived from the sum signal, given by (16), provide a referencing signal which can be used to remove contamination of the $G_{xz}$ and $G_{yz}$ signals by imperfect alignment of the sensors. This correction can be determined by a calibration procedure, where a range of controlled uniform fields are applied to the instrument 100 and the apparent $B_{xz}$ and $B_{yz}$ gradient components measured. The coefficients of proportionality between the applied $B_x$ and $B_y$ fields and the apparent $G_{xz}$ and $G_{yz}$ gradients can be used to correct these measured gradient components for slight departures from perfect alignment of the z'-axis with the instrument Z axis.

FIGS. 4A to 4D show a sensor arrangement and trajectories for two sensors S1 and S2 according to some embodiments. The two sensors S1 and S2 follow circular trajectories with the trajectory and sensor rotation of each sensor being similar to that described in relation to FIGS. 3A to 3D. The sensors are located at opposite ends of an orbital diameter, orbiting the instrument z axis at angular velocity $\omega_1$. Sensitive axes $u_1$ and $u_2$ of respective sensors S1 and S2 rotate about an axis along the diameter of the orbit with angular velocity $\omega_2$. In some embodiments, the sensors S1 and S2 may be inclined with respect to each other in their respective x'z'-planes and sensitive axes $u_1$ and $u_2$ may be offset by a difference in rotation angle $\Delta\varphi$ in order to further reduce or mitigate magnetic interference between the sensors. The difference in rotation angle $\Delta\varphi$ may be any suitable angle between 0° and 180°, such as 90°, for example. In other embodiments, the sensors S1 and S2 may be fixed in parallel relative to each other with $\Delta\varphi=0°$.

The measured fields in sensors S1 and S2, located at $r_1$ and $-r_1$ respectively, are given by $$B_{u_1} = B_{x_1'}\cos\varphi + B_{z_1'}\sin\varphi,$$

$$B_{u_2} = B_{x_2'}\cos\varphi + B_{z_2'}\sin\varphi \quad(18)$$

Using (2) and (3), in terms of the field and gradient components with respect to the instrument the measured field is therefore $$B_{u_1} = [\overline{B}_x\cos\theta + \overline{B}_y\sin\theta - (a/2)G_{xy}\cos2\theta + (a/4)(G_{xx} - G_{yy})\sin2\theta]\cos\quad(19)$$
$$\varphi + \overline{B}_z\sin\varphi + (a/2)G_{xz}\sin\theta\sin\varphi - (a/2)G_{yz}\cos\theta\sin\varphi] =$$
$$\frac{\overline{B}_x}{2}[\cos(\theta - \varphi) + \cos(\theta + \varphi)] + \frac{\overline{B}_y}{2}[\sin(\theta - \varphi) + \sin(\theta + \varphi)] +$$
$$\overline{B}_z\sin\varphi + \frac{b}{2}\left\{-\frac{G_{xy}}{2}[\cos(2\theta - \varphi) + \cos(2\theta + \varphi)] +\right.$$
$$\frac{(G_{xx} - G_{yy})}{4}[\sin(2\theta - \varphi) + \sin(2\theta + \varphi)] +$$
$$\left.\frac{G_{xz}}{2}[\cos(\theta - \varphi) - \cos(\theta + \varphi)] + \frac{G_{yz}}{2}[\sin(\theta - \varphi) - \sin(\theta + \varphi)]\right\}.$$

$$B_{u_2} = [\overline{B}_x\cos\theta + \overline{B}_y\sin\theta + (a/2)G_{xy}\cos2\theta - (a/4)(G_{xx} - G_{yy})\sin2\theta]\cos\quad(20)$$
$$\varphi + \overline{B}_z\sin\varphi - (a/2)G_{xz}\sin\theta\sin\varphi + (a/2)G_{yz}\cos\theta\sin\varphi] =$$
$$\frac{\overline{B}_x}{2}[\cos(\theta - \varphi) + \cos(\theta + \varphi)] + \frac{\overline{B}_y}{2}[\sin(\theta - \varphi) + \sin(\theta + \varphi)] +$$
$$\overline{B}_z\sin\varphi + \frac{b}{2}\left\{\frac{G_{xy}}{2}[\cos(2\theta - \varphi) - \cos(2\theta + \varphi)] -\right.$$
$$\frac{(G_{xx} - G_{yy})}{4}[\sin(2\theta - \varphi) + \sin(2\theta + \varphi)] -$$
$$\left.\frac{G_{xz}}{2}[\cos(\theta - \varphi) - \cos(\theta + \varphi)] - \frac{G_{yz}}{2}[\sin(\theta - \varphi) - \sin(\theta + \varphi)]\right\}.$$

In terms of the rotation frequencies the sum and difference of the measured outputs are given by:

$$B_{u_1} + B_{u_2} =\quad(21)$$
$$\overline{B}_x[\cos(\theta - \varphi) + \cos(\theta + \varphi)] + \overline{B}_y[\sin(\theta - \varphi) + \sin(\theta + \varphi)] + 2\overline{B}_z\sin\varphi =$$
$$\overline{B}_x[\cos((\omega_1 - \omega_2)t) + \cos((\omega_1 + \omega_2)t)] +$$
$$\overline{B}_y[\sin((\omega_1 - \omega_2)t) + \sin((\omega_1 + \omega_2)t)] + 2\overline{B}_z\sin(\omega_2 t),$$

$$B_{u_1} - B_{u_2} = \frac{a}{2}\left\{G_{xy}[\cos(\theta - \varphi) - \cos(2\theta + \varphi)] -\right.\quad(22)$$
$$\frac{(G_{xx} - G_{yy})}{2}[\sin(2\theta - \varphi) + \sin(2\theta + \varphi)] -$$
$$\left.G_{xz}[\cos(\theta - \varphi) - \cos(\theta + \varphi)] - G_{yz}[\sin(\theta - \varphi) - \sin(\theta + \varphi)]\right\} =$$
$$\frac{a}{2}\left\{G_{xy}[\cos((2\omega_1 - \omega_2)t) - \cos((2\omega_1 + \omega_2)t)] -\right.$$
$$\frac{(G_{xx} - G_{yy})}{2}[\sin((2\omega_1 - \omega_2)t) + \sin((2\omega_1 + \omega_2)t)] -$$
$$G_{xz}[\cos((\omega_1 - \omega_2)t) - \cos((\omega_1 + \omega_2)t)] -$$
$$\left.G_{yz}[\sin((\omega_1 - \omega_2)t) - \sin((\omega_1 + \omega_2)t)]\right\}$$

It follows from (21) that all three components of the field vector can be extracted from the Fourier components of the sum of the signals:

$$\overline{B}_x = I_S(\omega_1-\omega_2)=I_S(\omega_1+\omega_2)=[I_S(\omega_1-\omega_2)+I_S(\omega_1+\omega_2)]/2,$$

$$\overline{B}_y = Q_S(\omega_1-\omega_2)=Q_S(\omega_1+\omega_2)=[Q_S(\omega_1-\omega_2)+Q_S(\omega_1+\omega_2)]/2,$$

$$\overline{B}_z = Q_S(\omega_2)/2,\quad(23)$$

where the subscript S denotes the sum. These components are offset-free and, if the rotation frequencies are chosen to ensure that the sidebands at $\omega_1 \pm \omega_2$ are above the 1/f noise corner, exhibit negligible drift and low noise.

Similarly it follows from (22) that in principle all three off-diagonal components of the gradient tensor and the difference between the two diagonal tensor components in the plane of rotation can be calculated from the Fourier components of the difference signal (denoted by subscript D):

$$G_{xy} = \frac{2I_D(2\omega_1 + \omega_2)}{a} = \tag{24}$$

$$-\frac{2I_D(2\omega_1 - \omega_2)}{a} = \frac{[I(2\omega_1 + \omega_2) - I(2\omega_1 - \omega_2)]}{a},$$

$$G_{xz} = \frac{2I_D(\omega_1 + \omega_2)}{a} =$$

$$-\frac{2I_D(\omega_1 - \omega_2)}{a} = \frac{[I_D(\omega_1 + \omega_2) - I_D(\omega_1 - \omega_2)]}{a},$$

$$G_{yz} = \frac{2Q_D(\omega_1 + \omega_2)}{a} =$$

$$-\frac{2Q_D(\omega_1 - \omega_2)}{a} = \frac{[Q_D(\omega_1 + \omega_2) - Q_D(\omega_1 - \omega_2)]}{a},$$

$$G_{xx} - G_{yy} = -\frac{4Q_D(2\omega_1 - \omega_2)}{a} =$$

$$-\frac{4Q_D(2\omega_1 + \omega_2)}{a} = \frac{-2[Q_D(2\omega_1 - \omega_2) + Q_D(2\omega_1 + \omega_2)]}{a}.$$

Comparison of (23) and (24) shows that any imbalance of the two sensors, which would give rise to a common mode signal when their outputs are differenced, produces Fourier components at $\omega_1 + \omega_2$, which contaminate the signal from $B_{xz}$ and $B_{yz}$. However, the vector components derived from the sum signal, given by (23), provide a referencing signal which can be used to remove contamination of the $B_{xz}$ and $B_{yz}$ signals by imperfect balance of the sensors. This correction can be determined by a calibration procedure, where a range of controlled uniform fields are applied to the instrument and the apparent $B_{xz}$ and $B_{yz}$ gradient components measured. The coefficients of proportionality between the applied $B_x$ and $B_y$ fields and the apparent $B_{xz}$ and $B_{yz}$ gradients can be used to correct these measured gradient components for the common mode signal due to applied fields.

If two of these dual rotating, orbiting magnetometer systems are mounted along the instrument z axis, separated by a baseline $z_0$, then the field vector and gradient tensor midway between these two sensors are given by equations (16) and (17), allowing all components of the gradient tensor to be determined without cross-contamination of frequency components. The baseline $z_0$ should be sufficient to ensure that magnetic and electronic interference between the systems is negligible. Increasing the length of the baseline along z improves the sensitivity of the gradient measurements along z, but $z_0$ should be small compared to the distance to the nearest magnetic sources to ensure that that the measurement accurately determines a first order gradient, rather than a finite difference.

The sensor trajectory shown in FIGS. 5A to 5D is the same as the trajectory shown in FIGS. 2A to 2D, however the sensitive axis u is rotating with respect to X'. The sensitive axis u rotates in the z'y'-plane about x' (and perpendicular to x') with angular velocity $\omega_2$ and rotation angle $\varphi$ ($\varphi=0$ when u is parallel to y', $\varphi$ is defined as positive as measured between y' and u from y' towards z', and $\varphi=\omega_2 t$, where t=time).

The measured field is given by $$B_u = B_{y'} \cos \varphi + B_{z'} \sin \varphi \tag{25}$$

Using (8) and (9), in terms of the field and gradient components with respect to the instrument, the measured field is therefore $$B_u = \overline{B}_{y'} \cos\varphi +$$

$$B_{z'}\sin\varphi = [-\overline{B}_x \sin\theta + \overline{B}_y \cos\theta + G_{zz}a/4 + (a/4)(G_{xx} - G_{yy})\cos 2\theta +$$

$$(a/2)G_{xy}\sin 2\theta]\cos\varphi + [\overline{B}_z + (a/2)G_{xz}\sin\theta - (a/2)G_{yz}\cos\theta]\sin\varphi =$$

$$-\frac{\overline{B}_x}{2}[\sin(\theta - \varphi) + \sin(\theta + \varphi)] + \frac{\overline{B}_y}{2}[\cos(\theta - \varphi) + \cos(\theta + \varphi)] +$$

$$\overline{B}_z \sin\varphi + \frac{a}{4}\Big\{G_{zz}\cos\varphi + G_{xy}[\sin(2\theta - \varphi) + \sin(2\theta + \varphi)] +$$

$$\frac{(G_{xx} - G_{yy})}{2}[\cos(2\theta - \varphi) + \cos(2\theta + \varphi)] +$$

$$G_{xz}[\cos(\theta - \varphi) - \cos(\theta + \varphi)] + G_{yz}[\sin(\theta - \varphi) - \sin(\theta + \varphi)]\Big\}.$$

In terms of the rotation frequencies, the measured field is therefore $$B_u = -\frac{\overline{B}_x}{2}[\sin((\omega_1 - \omega_2)t) + \sin((\omega_1 + \omega_2)t)] +$$

$$\frac{\overline{B}_y}{2}[\cos((\omega_1 - \omega_2)t) + \cos((\omega_1 + \omega_2)t] + \overline{B}_z \sin(\omega_2 t) +$$

$$\frac{a}{2}\Big\{G_{zz}\cos(\omega_2 t) + \frac{G_{xy}}{2}[\sin((2\omega_1 - \omega_2)t) + \sin((2\omega_1 + \omega_2)t)] +$$

$$\frac{(G_{xx} - G_{yy})}{2}[\cos((2\omega_1 - \omega_2)t) + \cos((2\omega_1 + \omega_2)t)] +$$

$$\frac{G_{xz}}{2}[\cos((\omega_1 - \omega_2)t) - \cos((\omega_1 + \omega_2)t)] +$$

$$\frac{G_{yz}}{2}[\sin((\omega_1 - \omega_2)t) - \sin((\omega_1 + \omega_2)t)]\Big\}.$$

Collecting terms and simplifying gives an expression for the Fourier components in terms of field and gradient components $$B_u = \left(\frac{\overline{B}_y}{2} + \frac{G_{xz}a}{4}\right)\cos((\omega_1 - \omega_2)t) + \tag{26}$$

$$\left(\frac{\overline{B}_y}{2} - \frac{G_{xz}a}{4}\right)\cos((\omega_1 + \omega_2)t) - \left(\frac{\overline{B}_x}{2} - \frac{G_{yz}a}{4}\right)\sin((\omega_1 - \omega_2)t) -$$

$$\left(\frac{\overline{B}_x}{2} + \frac{G_{yz}a}{4}\right)\sin((\omega_1 + \omega_2)t) + (G_{zz}a/4)\cos(\omega_2 t) + \overline{B}_z \sin(\omega_2 t) +$$

$$\frac{(G_{xx} - G_{yy})a}{8}\cos((2\omega_1 - \omega_2)t) + \frac{(G_{xx} - G_{yy})a}{8}\cos((2\omega_1 + \omega_2)t) +$$

$$\frac{G_{xy}a}{4}\sin((2\omega_1 - \omega_2)t) + \frac{G_{xy}a}{4}\sin((2\omega_1 + \omega_2)t)$$

It follows from (26) that all three components of the field vector and all components of the gradient tensor are given by $$\overline{B}_x = -Q(\omega_1 - \omega_2) - Q(\omega_1 + \omega_2), \quad (27)$$

$$\overline{B}_y = I(\omega_1 - \omega_2) + I(\omega_1 + \omega_2), \overline{B}_z = Q(\omega_2),$$

$$G_{xx} = \frac{2[I(2\omega_1 - \omega_2) + I(\omega_1 + \omega_2) - I(\omega_2)]}{a},$$

$$G_{xy} = \frac{2[Q(2\omega_1 - \omega_2) + Q(2\omega_1 + \omega_2)]}{a},$$

$$G_{xz} = \frac{2[I(\omega_1 - \omega_2) - I(\omega_1 + \omega_2)]}{a},$$

$$G_{yy} = \frac{-2[I(\omega_2) + I(2\omega_1 - \omega_2) + I(2\omega_1 + \omega_2)]}{a},$$

$$G_{yz} = \frac{2[Q(\omega_1 - \omega_2) - Q(\omega_1 + \omega_2)]}{a}, G_{zz} = 4I(\omega_2)/a.$$

where $I(\omega)$, $Q(\omega)$ denote calibrated in-phase and quadrature Fourier components at angular frequency $\omega$. Frequency domain separation yields reliable estimates of $G_{xx}$, $G_{xy}$, $G_{yy}$ and $G_{zz}$, but estimates of $G_{xz}$ and $G_{yz}$ may be contaminated by contributions from $B_y$ and $B_y$ at the same frequencies. This contamination can be mitigated by calibration. If the instrument is subjected to a range of uniform applied fields along x and y, correction coefficients that enable removal of the apparent gradient components due to applied field components can be determined. Alternatively, if the instrument is removed to a place where there is an essentially uniform background field, such as the geomagnetic field in an area of essentially non-magnetic rocks, or at high altitude, calibration of the instrument can be achieved by measuring the apparent field and gradient signals while the instrument is in several different orientations, so that all three background geomagnetic field components vary with respect to the instrument reference frame, and solving, in a least-squares sense, an over-determined matrix equation for the correction coefficients. This calibration method also pertains to the other embodiments described.

If two of these rotating, orbiting magnetometer systems are mounted along the instrument z axis, separated by a baseline $z_0$, then the field vector and gradient tensor midway between these two sensors are given by (16) and (17). The remarks above regarding calibration and alignment for dual sensors, separated along the instrument z axis, that rotate about the radius vector also apply to the case of rotation about a tangential axis.

FIGS. 6A to 6D show a sensor arrangement and trajectories for two sensors S1 and S2 according to some embodiments. The two sensors S1 and S2 follow circular trajectories with the trajectory and sensor rotation of each sensor being similar to that described in relation to FIGS. 5A to 5D. The sensors are located at opposite ends of an orbital diameter, orbiting the instrument z axis at angular velocity $\omega_1$. Sensitive axes $u_1$ and $u_2$ of respective sensors S1 and S2 rotate about an axis x' which is tangential to the motion. In some embodiments, the sensors S1 and S2 may be inclined with respect to each other in their respective y'z'-planes and sensitive axes $u_1$ and $u_2$ may be offset by a difference in rotation angle $\Delta\varphi$ in order to further reduce or mitigate magnetic interference between the sensors. The difference in rotation angle $\Delta\varphi$ may be any suitable angle between 0° and 180°, such as 90°, for example. In other embodiments, the sensors S1 and S2 may be fixed in parallel relative to each other with $\Delta\varphi=0°$.

The measured fields in sensors 1 and 2, located at r and $-r$ respectively, are given by $$B_{u_1} = B_{y_1'} \cos\varphi + B_{z_1'} \sin\varphi,$$

$$B_{u_2} = B_{y_2'} \cos\varphi + B_{z_2'} \sin\varphi \quad (28)$$

Using (2), (8) and (9), in terms of the field and gradient components with respect to the instrument the measured fields are therefore $$B_{u_1} = [-\overline{B}_x \sin\theta + \overline{B}_y \cos\theta + G_{zz}a/4 + (a/4)(G_{xx}-G_{yy})\cos 2\theta + (a/2)G_{xy} \sin 2\theta] \cos\varphi + [\overline{B}_z + (a/2)G_{xz} \sin\theta - (a/2)G_{yz} \cos\theta] \sin\varphi,$$

$$B_{u_2} = [-\overline{B}_x \sin\theta + \overline{B}_y \cos\theta - G_{zz}a/4 - (a/4)(G_{xx}-G_{yy})\cos 2\theta - (a/2)G_{xy} \sin 2\theta] \cos\varphi + [\overline{B}_z - (a/2)G_{xz} \sin\theta + (a/2)G_{yz} \cos\theta] \sin\varphi \quad (29)$$

Expressing products of trigonometric functions in terms of sums and differences gives $$B_{u_1} = -\frac{\overline{B}_x}{2}[\sin(\theta-\varphi) + \sin(\theta+\varphi)] + \frac{\overline{B}_y}{2}[\cos(\theta-\varphi) + \cos(\theta+\varphi)] + \quad (30)$$
$$\overline{B}_z \sin\varphi + \frac{a}{4}\{G_{zz}\cos\varphi + G_{xy}[\sin(2\theta-\varphi) + \sin(2\theta+\varphi)] +$$
$$\frac{(G_{xx}-G_{yy})}{2}[\cos(2\theta-\varphi) + \cos(2\theta+\varphi)] +$$
$$G_{xz}[\cos(\theta-\varphi) - \cos(\theta+\varphi)] + G_{yz}[\sin(\theta-\varphi) - \sin(\theta+\varphi)]\}.$$

$$B_{u_2} = -\frac{\overline{B}_x}{2}[\sin(\theta-\varphi) + \sin(\theta+\varphi)] + \frac{\overline{B}_y}{2}[\cos(\theta-\varphi) + \cos(\theta+\varphi)] + \quad (31)$$
$$\overline{B}_z \sin\varphi - \frac{a}{4}\{G_{zz}\cos\varphi + G_{xy}[\sin(2\theta-\varphi) + \sin(2\theta+\varphi)] +$$
$$\frac{(G_{xx}-G_{yy})}{2}[\cos(2\theta-\varphi) + \cos(2\theta+\varphi)] +$$
$$G_{xz}[\cos(\theta-\varphi) - \cos(\theta+\varphi)] + G_{yz}[\sin(\theta-\varphi) - \sin(\theta+\varphi)]\}.$$

In terms of the rotation frequencies the sum and difference of the measured outputs are given by:

$$B_S = B_{u_1} + B_{u_2} = \quad (32)$$
$$\overline{B}_y[\cos(\theta-\varphi) + \cos(\theta+\varphi)] - \overline{B}_x[\sin(\theta-\varphi) + \sin(\theta+\varphi)] +$$
$$2\overline{B}_z \sin\varphi = \overline{B}_y[\cos((\omega_1-\omega_2)t) + \cos((\omega_1+\omega_2)t)] -$$
$$\overline{B}_x[\sin((\omega_1-\omega_2)t) + \sin((\omega_1+\omega_2)t)] + 2\overline{B}_z \sin(\omega_2 t),$$

$$B_D = B_{u_1} - B_{u_2} = \quad (33)$$
$$\frac{a}{2}\{(G_{xx}-G_{yy})[\cos(2\theta-\varphi) + \cos(2\theta+\varphi)]/2 + G_{xy}[\sin(2\theta-\varphi) +$$
$$\sin(2\theta+\varphi)] + G_{xz}[\cos(\theta-\varphi) + \cos(\theta+\varphi)] +$$
$$G_{yz}[\sin(\theta-\varphi) - \sin(\theta+\varphi)]\} =$$
$$\frac{a}{2}\{(G_{xx}-G_{yy})[\cos((2\omega_1-\omega_2)t) + \cos((2\omega_1+\omega_2)t)]/2 +$$
$$G_{xy}[\sin((2\omega_1-\omega_2)t) + \sin((2\omega_1+\omega_2)t)] +$$
$$G_{xz}[\cos((\omega_1-\omega_2)t) + \cos((\omega_1+\omega_2)t)] +$$
$$G_{yz}[\sin((\omega_1-\omega_2)t) - \sin((\omega_1+\omega_2)t)]\}.$$

It follows from (32) that all three components of the field vector can be extracted from the Fourier components of the sum of the signals:

$$\overline{B}_x = -Q_S(\omega_1-\omega_2) = -Q_S(\omega_1+\omega_2) = -[Q_S(\omega_1-\omega_2) + Q_S(\omega_1+\omega_2)]/2,$$

$$\overline{B}_y = I_S(\omega_1-\omega_2) = I_S(\omega_1+\omega_2) = [I_S(\omega_1-\omega_2) + I_S(\omega_1+\omega_2)]/2,$$

$$\overline{B}_z = Q_S(\omega_2)/2, \quad (34)$$

where the subscript S denotes the sum. These components are offset-free and, if the rotation frequencies are chosen to ensure that the sidebands at $\omega_1 \pm \omega_2$ are above the 1/f noise corner, exhibit negligible drift and low noise.

Similarly it follows from (33) that in principle all components of the gradient tensor can be calculated from the Fourier components of the difference signal (denoted by subscript D):

$$G_{xy} = \frac{2Q_D(2\omega_1 + \omega_2)}{a} = \tag{35}$$

$$\frac{2Q_D(2\omega_1 - \omega_2)}{a} = \frac{[Q(2\omega_1 + \omega_2) + Q(2\omega_1 - \omega_2)]}{a},$$

$$G_{xz} = \frac{2I_D(\omega_1 + \omega_2)}{a} =$$

$$\frac{2I_D(\omega_1 - \omega_2)}{a} = \frac{[I_D(\omega_1 + \omega_2) + I_D(\omega_1 - \omega_2)]}{a},$$

$$G_{yz} = -\frac{2Q_D(\omega_1 + \omega_2)}{a} =$$

$$\frac{2Q_D(\omega_1 - \omega_2)}{a} = \frac{[Q_D(\omega_1 - \omega_2) - Q_D(\omega_1 + \omega_2)]}{a},$$

$$G_{xx} - G_{yy} = \frac{4I_D(2\omega_1 - \omega_2)}{a} =$$

$$\frac{4I_D(2\omega_1 + \omega_2)}{a} = \frac{2[I_D(2\omega_1 - \omega_2) + I_D(2\omega_1 + \omega_2)]}{a},$$

$$G_{xx} = \frac{(G_{xx} - G_{yy}) - G_{zz}}{2} =$$

$$\frac{[I_D(2\omega_1 - \omega_2) + I_D(2\omega_1 + \omega_2) - I_D(\omega_2)]}{a},$$

$$G_{yy} = \frac{-(G_{xx} - G_{yy}) - G_{zz}}{2} =$$

$$\frac{-[I_D(2\omega_1 - \omega_2) + I_D(2\omega_1 + \omega_2) + I_D(\omega_2)]}{a},$$

$$G_{zz} = -(G_{xx} + G_{yy}) = \frac{2I_D(\omega_2)}{a}.$$

Comparison of (34) and (35) shows that any imbalance of the two sensors, which would give rise to a common mode signal when their outputs are differenced, produces Fourier components at $\omega_1 \pm \omega_2$, which contaminate the signal from $B_{xz}$ and $B_{yz}$. However, the vector components derived from the sum signal, given by (34), provide a referencing signal which can be used to remove contamination of the $B_{xz}$ and $B_{yz}$ signals by imperfect balance of the sensors. This correction can be determined by a calibration procedure, where a range of controlled uniform fields are applied to the instrument and the apparent $B_{xz}$ and $B_{yz}$ gradient components measured. The coefficients of proportionality between the applied $B_x$ and $B_y$ fields and the apparent $B_{xz}$ and $B_{yz}$ gradients can be used to correct these measured gradient components for the common mode signal due to applied fields.

If two of these dual rotating, orbiting magnetometer systems are mounted along the instrument z axis, separated by a baseline $z_0$, then the field vector and gradient tensor midway between these two sensors are given by equations (16) and (17), allowing all components of the gradient tensor to be determined without cross-contamination of frequency components. The alternative, second, expressions for $G_{xz}$ and $G_{yz}$ on the right hand side of (17) and the expression for $G_{zz}$ are unaffected by overlapping frequencies, but require accurate alignment of xyz axes at each location along the z axis. To a first order approximation, in small azimuthal misalignment angles, $\delta$ radians, between the xy axes at the two z locations, the error in the estimated $G_{xz}$ is proportional to $B_y\delta$ and in the estimated $G_{yz}$ is proportional to $B_x\delta$. A similar remark applies to misalignment of z axes. These errors can be corrected by calibration, applying a range of uniform fields along orthogonal directions to determine the coefficients required to remove the effects of misalignment, or by deploying the instrument in a region of negligible geomagnetic gradient and presenting it to the geomagnetic field in various orientations, as explained above.

The sensor trajectory shown in FIGS. 7A to 7E is the same as the trajectory shown in FIGS. 2A to 2D, but the sensitive axis u is rotating about an inclined axis relative to X'. A third reference frame X"=(x",y",z") is inclined and fixed with respect to X'. The inclined frame X" is rotated about y' by an angle $\psi$ such that y"=y', there is an angle $\psi$ between z" and z' and there is an angle $\psi$ between x" and x'. The angle $\psi$ is defined as positive as measured between x' and x" from x' towards z'.

The sensitive axis u is located at the X" origin O"=O'=$r_1$ and rotates in the x"y"-plane about z" (and perpendicular to z") with angular velocity $\omega_2$ and rotation angle $\varphi$ ($\varphi=0$ when u is parallel to x", $\varphi$ is defined as positive as measured between x" and u from x" towards y", and $\varphi=\omega_2 t$, where t=time).

The field component measured by the sensor 110 is given by:

$$B_u = B_{x''}\cos\varphi + B_{y''}\sin\varphi, \tag{36}$$

where $$B_{x''} = B_{x'}\cos\psi + B_{z'}\sin\psi = B_{x'}\cos\psi + B_z\sin\psi, \tag{37}$$

$$B_{x'} = B_x\cos\theta + B_y\sin\theta, \tag{38}$$

$$B_{y''} = B_{y'} = -B_x\sin\theta + B_y\cos\theta \tag{39}$$

Substituting (37)-(39) into (36) gives $$B_u = B_x[\cos\psi\cos\theta\cos\varphi - \sin\theta\sin\varphi] + \tag{40}$$

$$B_y[\cos\psi\sin\theta\cos\varphi + \cos\theta\sin\varphi] + B_z\sin\psi\cos\varphi =$$

$$B_x\left[\frac{\cos\psi}{2}[\cos(\theta-\varphi) + \cos(\theta+\varphi)] - \frac{1}{2}[\cos(\theta-\varphi) - \cos(\theta+\varphi)]\right] +$$

$$B_y\left[\frac{\cos\psi}{2}[\sin(\theta-\varphi) + \sin(\theta+\varphi)] - \frac{1}{2}[\sin(\theta-\varphi) - \sin(\theta+\varphi)]\right] +$$

$$B_z\sin\psi\cos\varphi$$

The field components at an instantaneous measurement point are $$B_x(x,y) = B_x\left(\frac{a}{2}\sin\theta, -\frac{a}{2}\cos\theta\right) = \overline{B}_x + (a/2)G_{xx}\sin\theta - (a/2)G_{xy}\cos\theta, \tag{41}$$

$$B_y(x,y) = B_y\left(\frac{a}{2}\sin\theta, -\frac{a}{2}\cos\theta\right) = \overline{B}_y + (a/2)G_{xy}\sin\theta - (a/2)G_{yy}\cos\theta,$$

$$B_z(x,y) = B_z\left(\frac{a}{2}\sin\theta, -\frac{a}{2}\cos\theta\right) = \overline{B}_z + (a/2)G_{xz}\sin\theta - (a/2)G_{yz}\cos\theta$$

Substituting (40) into (41) and rearranging gives $$B_u = \frac{\overline{B}_x}{2}[(\cos\psi - 1)\cos(\theta - \varphi) + (\cos\psi + 1)\cos(\theta + \varphi)] + \tag{42}$$

$$\frac{\overline{B}_y}{2}[(\cos\psi - 1)\cos(\theta - \varphi) + (\cos\psi + 1)\cos(\theta + \varphi)] + \overline{B}_z\sin\psi\cos\varphi +$$

-continued
$$\frac{a}{4}[G_{xx}[(\cos\psi - 1)\cos(\theta - \varphi)\sin\theta + (\cos\psi + 1)\cos(\theta + \varphi)\sin\theta] -$$
$$G_{xy}[(\cos\psi - 1)\cos(\theta - \varphi)\cos\theta + (\cos\psi + 1)\cos(\theta + \varphi)\cos\theta +$$
$$G_{xy}[(\cos\psi - 1)\sin(\theta - \varphi)\sin\theta + (\cos\psi + 1)\sin(\theta + \varphi)\sin\theta -$$
$$G_{yy}[(\cos\psi - 1)\sin(\theta - \varphi)\cos\theta + (\cos\psi + 1)\sin(\theta + \varphi)$$
$$\cos\theta] + 2G_{xz}\sin\psi\sin\theta\cos\varphi - 2G_{yz}\sin\psi\cos\theta\cos\varphi]$$

Inserting explicit time dependencies, expressing products of trigonometric functions in terms of as sums and differences of sines and cosines, and collecting terms with common frequencies gives $$B_u = \left(-\frac{\bar{B}_x}{2}(1 - \cos\psi) - \frac{G_{yz}a}{4}\sin\psi\right)\cos(\omega_1 - \omega_2)t - \quad (43)$$
$$\left(\frac{\bar{B}_y}{2}(1 - \cos\psi) - \frac{G_{xz}a}{4}\sin\psi\right)\sin(\omega_1 - \omega_2)t + \bar{B}_z\sin\psi\cos\omega_2 t -$$
$$\frac{(G_{xx} + G_{yy})a}{4}\sin\omega_2 t + \left(\frac{\bar{B}_x}{2}(1 + \cos\psi) - \frac{G_{yz}a}{4}\sin\psi\right)\cos(\omega_1 + \omega_2)t +$$
$$\left(\frac{\bar{B}_y}{2}(1 + \cos\psi) + \frac{G_{xz}a}{4}\sin\psi\right)\sin(\omega_1 + \omega_2)t +$$
$$\frac{G_{xy}a}{4}(1 - \cos\psi)\cos(2\omega_1 - \omega_2)t +$$
$$\frac{(G_{yy} - G_{xx})a}{8}(1 - \cos\psi)\sin(2\omega_1 - \omega_2)t -$$
$$\frac{G_{xy}a}{4}(1 + \cos\psi)\cos(2\omega_1 + \omega_2)t +$$
$$\frac{(G_{xx} - G_{yy})a}{8}(1 + \cos\psi)\sin(2\omega_1 + \omega_2)t$$

From (43) the field and gradient components can be obtained from the frequency components of the signal:

$$\bar{B}_x = I(\omega_1 + \omega_2) - I(\omega_1 - \omega_2), \quad (44)$$
$$\bar{B}_y = Q(\omega_1 + \omega_2) - Q(\omega_1 - \omega_2), \bar{B}_z = I(\omega_2)/\sin\psi,$$
$$G_{xy} = \frac{2[I(2\omega_1 - \omega_2) - I(2\omega_1 + \omega_2)]}{a},$$
$$G_{xz} = \frac{-2[(1 + \cos\psi)Q(\omega_1 - \omega_2) + (1 - \cos\psi)Q(\omega_1 + \omega_2)]}{a\sin\psi},$$
$$G_{yz} = -\frac{2[(1 + \cos\psi)I(\omega_1 - \omega_2) + (1 - \cos\psi)I(\omega_1 + \omega_2)]}{a\sin\psi},$$
$$G_{xx} - G_{yy} = \frac{4[(1 + \cos\psi)Q(2\omega_1 - \omega_2) - (1 - \cos\psi)Q(2\omega_1 + \omega_2)]}{a\sin^2\psi},$$
$$G_{zz} = -(G_{xx} + G_{yy}) = \frac{-4Q(\omega_2)}{a}$$

The tensor components $G_{xx}$ and $G_{yy}$ are determined by the expressions for their sum and difference. Estimates of $G_{xz}$ and $G_{yz}$ require precise knowledge of $\psi$. An incorrect value of this angle will propagate contributions from $B_x$ and $B_y$ into estimates of $G_{xy}$ and $G_{yz}$, because the signals of these gradient components have the same frequency as the field components, unless careful calibration and referencing is carried out, whereas gradient components $G_{xy}$ and $G_{xx}-G_{yy}$ are cleanly separated from field components in the frequency domain.

Alternative ways of determining $G_{xz}$ and $G_{yz}$ include:
1. Calculating the differences between $B_x$ and $B_y$, measured using two orbiting spinning sensors, separated by a baseline along Z that is long enough to reduce interactions between the sensors to a negligible level, but is short compared to the distance to the nearest source of interest.
2. Differentiating the measured values of $B_x$ and $B_y$ with respect to z, as the instrument is moved along the z-axis.

For the particular case $\psi=0$, the rotation and orbital axes are aligned and the sensor axis is confined to the orbital plane. In this case some of the frequency components vanish and the field and gradient components that can be determined are $$\left. \begin{array}{l} \bar{B}_x = I(\omega_1 + \omega_2), \bar{B}_y = Q(\omega_1 + \omega_2), \\ G_{xy} = -\frac{2I(2\omega_1 + \omega_2)}{a}, \\ G_{xx} - G_{yy} = \frac{4Q(2\omega_1 + \omega_2)]}{a}, \\ G_{zz} = -(G_{xx} + G_{yy}) = \frac{-4Q(\omega_2)}{a} \end{array} \right\} (\psi = 0) \quad (45)$$

For the case $\psi=90°$, the rotation axis is tangential to the orbital path, with z" parallel to −x'. In this case equation (44) simplifies to $$\left. \begin{array}{l} \bar{B}_x = I(\omega_1 - \omega_2) + I(\omega_1 + \omega_2), \\ \bar{B}_y = Q(\omega_1 - \omega_2) + Q(\omega_1 + \omega_2), \bar{B}_z = I(\omega_2), \\ G_{xy} = -\frac{2[I(2\omega_1 + \omega_2) + I(2\omega_1 - \omega_2)]}{a}, \\ G_{xz} = \frac{2[Q(\omega_1 - \omega_2) + Q(\omega_1 + \omega_2)]}{a}, \\ G_{yz} = -\frac{2[I(\omega_1 - \omega_2) + I(\omega_1 + \omega_2)]}{a}, \\ G_{xx} - G_{yy} = \frac{4[Q(2\omega_1 + \omega_2) - Q(2\omega_1 - \omega_2)]}{a} \end{array} \right\} (\psi = 90°) \quad (46)$$

These limiting cases do not provide all vector and tensor components. An intermediate orientation of the rotation plane can provide more information. For example, $\psi=45°$ gives $$\left. \begin{array}{l} \bar{B}_x = I(\omega_1 - \omega_2) + I(\omega_1 + \omega_2), \\ \bar{B}_y = Q(\omega_1 - \omega_2) + Q(\omega_1 + \omega_2), \\ \bar{B}_z = \sqrt{2}\, Q(\omega_2), \\ G_{xy} = -\frac{2[I(2\omega_1 + \omega_2) + I(2\omega_1 - \omega_2)]}{a}, \\ G_{xz} = \frac{2\sqrt{2}\left[(1 + 1/\sqrt{2})Q(\omega_1 - \omega_2) + (1 - 1/\sqrt{2})Q(\omega_1 + \omega_2)\right]}{a}, \\ G_{yz} = -\frac{2\sqrt{2}\left[(1 + 1/\sqrt{2})I(\omega_1 - \omega_2) + (1 - 1/\sqrt{2})Q(\omega_1 + \omega_2)\right]}{a}, \\ G_{xx} - G_{yy} = \frac{8\left[\begin{array}{l}(1 - 1/\sqrt{2})Q(2\omega_1 + \omega_2) - \\ (1 + 1/\sqrt{2})Q(2\omega_1 - \omega_2)\end{array}\right]}{a}, \\ G_{zz} = -(G_{xx} + G_{yy}) = \frac{4\sqrt{2}\, Q(\omega_2)}{a} \end{array} \right\} \quad (47)$$

$(\psi = 45°)$

The sensor trajectory shown in FIGS. 8A to 8E is the same as the trajectory shown in FIGS. 2A to 2D, but the sensitive axis u is rotating about an inclined axis relative to X'. A third reference frame X"=(x",y",z"), which is different from the third reference frame X" of FIGS. 7A to 7E, is inclined and fixed with respect to X'. The inclined frame X" is rotated about x' by an angle $\psi$ such that x"=x, there is an angle $\psi$ between z" and z' and there is an angle $\psi$ between y" and y'. The angle $\psi$ is defined as positive as measured between z' and z" from z' towards y'.

The sensitive axis u is located at the X" origin O"=O'$r_1$ and rotates in the x"y"-plane about z" (and perpendicular to z") with angular velocity $\omega_2$ and rotation angle $\varphi$ ($\varphi$=0 when u is parallel to x", $\varphi$ is defined as positive as measured between x" and u from x" towards y", and $\varphi$=$\omega_2$t, where t=time).

The field components at an instantaneous measurement point $r_1$(x,y) are $$B(x,y)=\overline{B}+(a/2)(G_{xx}\cos\theta+G_{xy}\sin\theta)\hat{x}+(a/2)(G_{xy}\cos\theta+G_{yy}\sin\theta)\hat{y}+(a/2)(G_{xz}\cos\theta+G_{yz}\sin\theta)\hat{z} \quad (48)$$

The field component measured by the sensor 110 is given by:

$$B_u=B_{x''}\cos\varphi+B_{y''}\sin\varphi=B_{x'}\cos\varphi+B_{y''}\sin\varphi, \quad (49)$$

where $$B_{y''}=B_{y'}\cos\psi-B_{z'}\sin\psi=B_{y'}\cos\psi-B_z\sin\psi, \quad (50)$$

$$B_{x'}=B_x\cos\theta+B_y\sin\theta, \quad (51)$$

$$B_{y'}=-B_x\sin\theta+B_y\cos\theta. \quad (52)$$

Substituting (50)-(52) into (49) gives $$B_u = [(B_x\cos\theta + B_y\sin\theta)\cos\psi - B_z\sin\psi]\cos\varphi + \quad (53)$$
$$(-B_x\sin\theta + B_y\cos\theta)\sin\varphi =$$
$$B_x[\cos\psi\cos\theta\cos\varphi - \sin\theta\sin\varphi] + B_y[\cos\psi\cos\varphi\sin\theta + \sin\varphi\cos\theta] -$$
$$B_z\sin\psi\cos\varphi = B_x\left[\frac{\cos\psi}{2}[\cos(\varphi-\theta)+\cos(\varphi+\theta)] - \right.$$
$$\left.\frac{1}{2}[\cos(\varphi-\theta)-\cos(\varphi+\theta)]\right] +$$
$$B_y\left[\frac{\cos\psi}{2}[-\sin(\varphi-\theta)+\sin(\varphi+\theta)] + \right.$$
$$\left.\frac{1}{2}[\sin(\varphi-\theta)+\sin(\varphi+\theta)]\right] - B_z\sin\psi\cos\theta$$

Substituting (48) into (53) and rearranging gives $$B_u = \frac{\overline{B}_x}{2}[(\cos\psi-1)\cos(\varphi-\theta)+(\cos\psi+1)\cos(\varphi+\theta)] + \quad (54)$$
$$\frac{\overline{B}_y}{2}[(\cos\psi-1)\sin(\varphi-\theta)+(\cos\psi+1)\sin(\varphi+\theta)] - \overline{B}_z\sin\psi\cos\varphi +$$
$$\frac{a}{4}[G_{xx}[(\cos\psi-1)\cos(\varphi-\theta)\cos\theta+(\cos\psi+1)\cos(\varphi+\theta)\cos\theta] +$$
$$G_{xy}[(\cos\psi-1)\cos(\varphi-\theta)\sin\theta+(\cos\psi+1)\cos(\varphi+\theta)\sin\theta] +$$
$$G_{xy}[(\cos\psi-1)\sin(\varphi-\theta)\cos\theta+(\cos\psi+1)\sin(\varphi+\theta)\cos\theta] +$$
$$G_{yy}[(\cos\psi-1)\sin(\varphi-\theta)\sin\theta+(\cos\psi+1)\sin(\varphi+\theta)\sin\theta] -$$
$$G_{xz}\sin\psi[\cos(\varphi-\theta)+\cos(\varphi+\theta)] +$$
$$G_{yz}\sin\psi[\sin(\varphi-\theta)-\sin(\varphi+0)]]$$

Inserting explicit time dependencies, expressing products of trigonometric functions in terms of as sums and differences of sines and cosines, and collecting terms with common frequencies gives $$B_u = \left(-\overline{B}_z\sin\psi + \frac{(G_{xx}+G_{yy})a}{8}\cos\psi\right)\cos(\omega_2 t) \quad (55)$$
$$\left(-\frac{\overline{B}_x}{2}(1-\cos\psi) - \frac{G_{xz}a}{8}\sin\psi\right)\cos((\omega_2-\omega_1)t) +$$
$$\left(\frac{\overline{B}_y}{2}(1-\cos\psi) + \frac{G_{yz}a}{8}\sin\psi\right)\sin((\omega_2-\omega_1)t) +$$
$$\left(\frac{\overline{B}_x}{2}(1+\cos\psi) - \frac{G_{xz}a}{8}\sin\psi\right)\cos((\omega_2+\omega_1)t) +$$
$$\left(\frac{\overline{B}_y}{2}(1+\cos\psi) - \frac{G_{yz}a}{8}\sin\psi\right)\sin((\omega_2+\omega_1)t) +$$
$$\frac{(G_{yy}-G_{xx})a}{8}(1-\cos\psi)\cos((2\omega_2-\omega_1)t) +$$
$$\frac{G_{xy}a}{4}(1-\cos\psi)\sin((\omega_2-2\omega_1)t) +$$
$$\frac{(G_{xx}-G_{yy})a}{8}(1+\cos\psi)\cos((2\omega_2+\omega_1)t) +$$
$$\frac{G_{xy}a}{4}(1+\cos\psi)\sin((\omega_2+2\omega_1)t)$$

From (55) the field and gradient components can be obtained from the frequency components of the signal:

$$\overline{B}_x = I(\omega_2+\omega_1) - I(\omega_2-\omega_1), \quad (56)$$
$$\overline{B}_y = Q(\omega_2+\omega_1) + Q(\omega_2-\omega_1),$$
$$\overline{B}_z + \frac{G_{zz}a}{8}\cos\psi = -I(\omega_2)/\sin\psi,$$
$$G_{xy} = \frac{2[Q(2\omega_2-\omega_1)+Q(2\omega_2+\omega_1)]}{a},$$
$$G_{xz} = \frac{-4[I(\omega_2-\omega_1)+I(\omega_2+\omega_1)]}{a\sin\psi},$$
$$G_{yz} = \frac{4[Q(\omega_2-\omega_1)-Q(\omega_2+\omega_1)]}{a\sin\psi},$$
$$G_{xx}-G_{yy} = \frac{4[I(\omega_2+2\omega_1)-I(\omega_2-2\omega_1)]}{a}$$

The $\omega_1$ frequency component will normally be dominated by $B_z$. It is difficult to separate $B_z$ and $G_{zz}$ from measurements at a single location. Measurements made at closely spaced points as the sensor moves along the z axis allow independent estimates of $B_z$ and $G_{zz}$:

$$-\frac{[I_{\omega_2}(z_0+\Delta z/2) - I_{\omega_2}(z_0-\Delta z/2)]}{\Delta z\sin\psi} = \quad (57)$$
$$G_{zz}(z_0) + \frac{G_{zzz}(z_0)a\cot\psi}{8} \approx G_{zz}(z_0),$$
$$\frac{-1}{\sin\psi}\left[I_{\omega_2}(z_0) - \frac{[I_{\omega_2}(z_0+\Delta z/2) - I_{\omega_2}(z_0-\Delta z/2)]a\cot\psi}{8\Delta z}\right] =$$
$$\overline{B}_z(z_0) - \frac{G_{zzz}(z_0)a^2\cot^2\psi}{8} \approx \overline{B}_z(z_0)$$

The approximate equalities on the right-hand side of the expressions for $G_{zz}$ and $B_z$ are exact if the gradient is uniform, and are good approximations if the distance to the nearest magnetic source is at least several times the orbital diameter a. The tensor components $G_{xx}$ and $G_{yy}$ are determined by the expressions for their sum, which is $-G_{zz}$, and difference. Estimates of $G_{xz}$ and $G_{yz}$ require precise knowledge of $\psi$. An incorrect value of this angle will propagate contributions from $B_x$ and $B_y$ into estimates of $G_{xz}$ and $G_{yz}$, because the signals of these gradient components have the same frequency as the field components, unless careful calibration and referencing is carried out, whereas gradient components $G_{xy}$ and $G_{xx}-G_{yy}$ are cleanly separated from field components in the frequency domain.

FIGS. 9A to 9D show a sensor arrangement and trajectories for two sensors S1 and S2 according to some embodiments. The two sensors S1 and S2 follow parallel circular trajectories with the trajectory and sensor rotation of each sensor being similar to that described in relation to FIGS. 8A to 8E, and planes of each trajectory are separated by a certain distance in the z-direction of the instrument reference frame.

The sensors S1 and S2 are mounted at opposite ends of a common rotation axis (collinear with $z'_{S1}$ and $z'_{S2}$) which precesses about a midpoint between the two sensors. The precession axis is inclined relative to the instrument z-axis by an angle $\psi$, and precesses around the instrument z-axis at an angular velocity of $\omega_1$.

In some embodiments, the two sensors S1 and S2 may be separated by a large enough distance that magnetic interference between is negligible compared to the measured signal. In some embodiments, the sensors S1 and S2 may be inclined with respect to each other in their respective x"y"-planes and sensitive axes $u_1$ and $u_2$ may be offset by a difference in rotation angle $\Delta\varphi$ in order to further reduce or mitigate magnetic interference between the sensors. The difference in rotation angle $\Delta\varphi$ may be any suitable angle between 0° and 180°, such as 90°, for example. In other embodiments, the sensors S1 and S2 may be fixed in parallel relative to each other with $\Delta\varphi=0°$.

The sensitive axes of the sensors S1 and S2 may be denoted by $u_1$ and $u_2$ respectively, and the measured signals from each sensor may be combined to determine the components of the gradient tensor in the z-direction.

In the plane of the orbit of S1, the field at the instantaneous position $(x, y)=(a/2)(\sin\theta, -\cos\theta)$ of the sensor S1 is then $$B_{S1}(x,y) = \overline{B}_{S1} + (a/2)(G_{xx}\sin\theta - G_{xy}\cos\theta)\hat{x} + (a/2)(G_{xy}\sin\theta - G_{yy}\cos\theta)\hat{y} + (a/2)(G_{xz}\sin\theta - G_{yz}\cos\theta)\hat{z}. \tag{58}$$

The signal from the spinning orbiting sensor S1 is $$B_{u_1} = B_{yS1''}\cos\varphi + B_{xS1''}\sin\varphi, \tag{59}$$

where $$B_{yS1''} = B_{yS1}\cos\psi - B_z\sin\psi, \tag{60}$$

$$B_{xS1''} = B_x\cos\theta + B_y\sin\theta, \tag{61}$$

$$B_{yS1} = -B_x\sin\theta + B_y\cos\theta. \tag{62}$$

Substituting (60)-(62) into (59) gives $$B_{u_1} = [(-B_x\sin\theta + B_y\cos\theta)\cos\psi - B_z\sin\psi]\cos\varphi + \tag{63}$$

$$(B_x\cos\theta + B_y\sin\theta)\sin\varphi =$$

$$B_x[-\cos\psi\sin\theta\cos\varphi + \cos\theta\sin\varphi] + B_y[\cos\psi\cos\theta\cos\varphi + \sin\theta\sin\varphi] -$$

$$B_z\sin\psi\cos\varphi = B_x\left[-\frac{\cos\psi}{2}[\sin(\theta - \varphi) + \sin(\theta + \varphi)] - \right.$$

$$\left. \frac{1}{2}[\sin(\theta - \varphi) - \sin(\theta + \varphi)]\right] +$$

$$B_y\left[\frac{\cos\psi}{2}[\cos(\theta - \varphi) + \cos(\theta + \varphi)] + \right.$$

$$\left. \frac{1}{2}[\cos(\theta - \varphi) - \cos(\theta + \varphi)]\right] - B_z\sin\psi\cos\varphi.$$

Substituting (58) into (63) and rearranging gives $$B_{u_1} = \frac{\overline{B}_x}{2}[(\cos\psi - 1)\cos(\theta - \varphi) + (\cos\psi + 1)\cos(\theta + \varphi)] + \tag{64}$$

$$\frac{\overline{B}_y}{2}[(\cos\psi - 1)\sin(\theta - \varphi) + (\cos\psi + 1)\sin(\theta + \varphi)] - \overline{B}_z\sin\psi\cos\theta +$$

$$\frac{b}{4}[G_{xx}[(\cos\psi - 1)\cos(\theta - \varphi)\cos\varphi + (\cos\psi + 1)\cos(\theta + \varphi)\cos\varphi] +$$

$$G_{xy}[(\cos\psi - 1)\cos(\theta - \varphi)\sin\varphi + (\cos\psi + 1)\cos(\theta + \varphi)\sin\varphi] +$$

$$G_{xy}[(\cos\psi - 1)\sin(\theta - \varphi)\cos\varphi + (\cos\psi + 1)\sin(\theta + \varphi)\cos\varphi] +$$

$$G_{yy}[(\cos\psi - 1)\sin(\theta - \varphi)\sin\varphi + (\cos\psi + 1)\sin(\theta + \varphi)\sin\varphi] -$$

$$G_{xz}\sin\psi[\cos(\theta - \varphi) + \cos(\theta + \varphi)] +$$

$$G_{yz}\sin\psi[\sin(\theta - \varphi) - \sin(\theta + \varphi)]].$$

Inserting explicit time dependencies, expressing products of trigonometric functions in terms of as sums and differences of sines and cosines, and collecting terms with common frequencies gives $$B_{u_1} = \tag{65}$$

$$\left(-\overline{B}_z\sin\psi - \frac{(G_{xx} + G_{yy})a}{4}\cos\psi\right)\cos\omega_2 t \left(-\frac{\overline{B}_x}{2}(1 + \cos\psi) - \frac{G_{xz}a}{4}\sin\psi\right)$$

$$\sin(\omega_1 - \omega_2)t + \left(\frac{\overline{B}_y}{2}(1 + \cos\psi) + \frac{G_{yz}a}{4}\sin\psi\right)\cos(\omega_1 - \omega_2)t +$$

$$\left(\frac{\overline{B}_x}{2}(1 - \cos\psi) - \frac{G_{xz}a}{4}\sin\psi\right)\sin(\omega_1 + \omega_2)t -$$

$$\left(\frac{\overline{B}_y}{2}(1 - \cos\psi) - \frac{G_{yz}a}{4}\sin\psi\right)\cos(\omega_1 + \omega_2)t +$$

$$\frac{(G_{xx} - G_{yy})a}{8}(1 + \cos\psi)\cos(2\omega_1 - \omega_2)t +$$

$$\frac{G_{xy}a}{4}(1 + \cos\psi)\sin(2\omega_1 - \omega_2)t -$$

$$\frac{(G_{xx} - G_{yy})a}{8}(1 - \cos\psi)\cos(2\omega_1 + \omega_2)t -$$

$$\frac{G_{xy}a}{4}(1 - \cos\psi)\sin(2\omega_1 + \omega_2)t.$$

From (65) the field and gradient components can be obtained from the frequency components of the signal:

$$\overline{B}_x = Q(\omega_1 + \omega_2) - Q(\omega_1 - \omega_2), \tag{66}$$

$$\overline{B}_y = I(\omega_1 - \omega_2) - I(\omega_1 + \omega_2),$$

$$\overline{B}_z - \frac{G_{zz}a}{8}\cot\psi = -I(\omega_2)/\sin\psi,$$

$$G_{xy} = \frac{2[Q(2\omega_1 - \omega_2) - Q(2\omega_1 + \omega_2)]}{a},$$

-continued $$G_{xz} = \frac{-2[(1-\cos\psi)Q(\omega_1-\omega_2)+(1+\cos\psi)Q(\omega_1+\omega_2)]}{a\sin\psi},$$

$$G_{yz} = \frac{2[(1-\cos\psi)I(\omega_1-\omega_2)+(1+\cos\psi)I(\omega_1+\omega_2)]}{a\sin\psi},$$

$$G_{xx} - G_{yy} = \frac{4[I(2\omega_1-\omega_2)-I(2\omega_1+\omega_2)]}{a}.$$

The $\omega_2$ frequency component will normally be dominated by $B_z$. It may be difficult to separate $B_z$ and $G_{zz}$ completely from measurements of a single sensor precessing in a single orbital plane. Measurements made at closely spaced points as the sensor moves along the z axis allow independent estimates of $B_z$ and $G_{zz}$:

$$-\frac{[I_{\omega_1}(z_0+\Delta z/2)-I_{\omega_1}(z_0-\Delta z/2)]}{\Delta z \sin\psi} = \tag{67}$$

$$G_{zz}(z_0) + \frac{G_{zzz}(z_0)b\cot\psi}{8} \approx G_{zz}(z_0),$$

$$\frac{-1}{\sin\psi}\left[I_{\omega_1}(z_0) - \frac{[I_{\omega_1}(z_0+\Delta z/2)-I_{\omega_1}(z_0-\Delta z/2)]b\cot\psi}{8\Delta z}\right] =$$

$$\overline{B}_z(z_0) - \frac{G_{zzz}(z_0)b^2\cot^2\psi}{8} \approx \overline{B}_z(z_0).$$

The tensor components $G_{xx}$ and $G_{yy}$ are determined by the expressions for their sum, which is $-G_{zz}$, and difference. Estimates of $G_{xz}$ and $G_{yz}$ require precise knowledge of $\psi$. An incorrect value of this angle will propagate contributions from $B_x$ and $B_y$ into estimates of $G_{xz}$ and $G_{yz}$, because the signals of these gradient components have the same frequency as the field components, unless careful calibration and referencing is carried out, whereas gradient components $G_{xy}$ and $G_{xx}-G_{yy}$ are cleanly separated from field components in the frequency domain.

For the two sensor embodiment shown in FIGS. 9A to 9D, the expressions for the field and gradient components of sensor S2 have the same form as those for S1, but apply to fields in the orbital plane of S2, for which $z=+z_0/2$, whereas the orbital plane of S1 is at $z=-z_0/2$, referred to an origin of Z at the midway between the two orbital planes. The instantaneous position of the sensor S2 within its orbital plane is $(x, y)=(a/2)(-\sin\theta, \cos\theta)$, so for S2:

$$B_{S2}(x,y) = \overline{B}_{S2}(z=z_0/2)-(a/2)(G_{xx}\sin\theta - G_{xy}\cos\theta)\hat{x}-(a/2)(G_{xy}\sin\theta - G_{yy}\cos\theta)\hat{y}-(a/2)(G_{xz}\sin\theta - G_{yz}\cos\theta)\hat{z}. \tag{68}$$

Applying the same analysis to equation (68) and combining with equation (58), the field and gradient components at the midpoint of the two sensor configuration are given by $$\overline{B}_x = [Q_1(\omega_1+\omega_2)+Q_2(\omega_1+\omega_2)-Q(\omega_1-\omega_2)-Q_2(\omega_1-\omega_2)]/2, \tag{69}$$

$$\overline{B}_y = [I_1(\omega_1-\omega_2)+I_2(\omega_1-\omega_2)-I_2(\omega_1+\omega_2)-I_1(\omega_1+\omega_2)]/2,$$

$$\overline{B}_z = -[I_1(\omega_2)+I_2(\omega_2)]/2\sin\psi,$$

$$\overline{G}_{xy} = \frac{\begin{bmatrix} Q_1(2\omega_1-\omega_2)+Q_2(2\omega_1-\omega_2)-\\ Q_1(2\omega_1+\omega_2)-Q_2(2\omega_1+\omega_2) \end{bmatrix}}{a},$$

$$\overline{G}_{xz} = [Q_2(\omega_1+\omega_2)-Q_2(\omega_1-\omega_2)-Q_1(\omega_1+\omega_2)+Q_1(\omega_1-\omega_2)]/z_0,$$

$$\overline{G}_{yz} = [I_2(\omega_1-\omega_2)-I_2(\omega_1+\omega_2)-I_1(\omega_1-\omega_2)+I_1(\omega_1+\omega_2)]/z_0,$$

$$\overline{G}_{xx} - \overline{G}_{yy} = \frac{2\begin{bmatrix} I_1(2\omega_1-\omega_2)+I_2(2\omega_1-\omega_2)-\\ I_1(2\omega_1+\omega_2)-I_2(2\omega_1+\omega_2) \end{bmatrix}}{a},$$

$$\overline{G}_{zz} = -(\overline{G}_{xx}+\overline{G}_{yy}) = 2[I_1(\omega_2)-I_2(\omega_2)]/(a\cos\psi-2z_0\sin\psi).$$

In some embodiments, the X" frame may be inclined with respect to X and rotated about z' instead of x' or y'. In other embodiments, X" may be inclined with respect to X and rotated about x' and y', or y' and z', or z' and x', or x' and y' and z'. In various alternate embodiments, the sensitive axis u of the sensor 110 may rotate about any of the axes x', y', z', x", y" or z" of any of the previously described embodiments and may be directed perpendicular to the axis of rotation, or inclined with respect to the axis of rotation.

In the sensor trajectory shown in FIGS. 10A to 10D, the X' frame orbits the origin O at $r_1=$O' as described in relation to FIGS. 2A to 2D. However, a third reference frame X", which is different from the third reference frames of FIGS. 4A to 4D and 5A to 5D, is spaced from the X' frame and orbits the origin O' at $r_2=$O" in a plane of rotation which is tangential to the trajectory of O' with angular velocity $\omega_2$ and rotation angle $\varphi$ ($\varphi=0$ when x" is parallel to x', $\varphi$ is defined as positive as measured between x' and x" from x' towards z', and $\varphi=\omega_2 t$, where t=time).

The path described by $r_2$ is a circular orbit about origin O' in the x'z'-plane at a distance $|r_2|=b/2$ from the origin O', and the trajectory of the X" frame is such that x" is directed in the direction of motion, tangential to the orbit about origin O'; z" is directed radially inward towards origin O; and y" is directed parallel to and spaced from y'. The sensor 110 is positioned at the origin O" and the sensitive axis u is fixed relative to frame X" and directed along the x"-axis, but may be directed in various other directions in other embodiments.

The position of the sensor $r=r_1+r_2=(x,y,z)$ at time t is:

$$x = \frac{a}{2}\cos\omega_1 t - \frac{b}{2}\sin\omega_1 t \sin\omega_2 t, \tag{70}$$

$$y = \frac{a}{2}\sin\omega_1 t + \frac{b}{2}\cos\omega_1 t \sin\omega_2 t,$$

$$z = \frac{b}{2}\cos\omega_2 t$$

The magnetic field vector at the sensor is:

$$B(x, y, z) = \overline{B} + G \cdot r \tag{71}$$

$$= \overline{B} + (G_{xx}x + G_{xy}y + G_{xz}z)\hat{x} + (G_{xy}x + G_{yy}y + G_{yz}z)\hat{y} +$$

$$(G_{xz}x + G_{yz}y + G_{zz}z)\hat{z}$$

The field component measured by the sensor is:

$$B_u = B \cdot \hat{u} \tag{72}$$

$$= B \cdot [-\hat{x}\cos\omega_1 t \cos\omega_2 t - \hat{y}\sin\omega_1 t \cos\omega_2 t - \hat{z}\sin\omega_2 t]$$

$$= -B_x \cos\omega_1 t \cos\omega_2 t - B_y \sin\omega_1 t \cos\omega_2 t - B_z \sin\omega_2 t$$

Combining (70)-(72) and converting products of trigonometric functions into individual frequency components (sums and differences of multiples of $\omega_1$ and $\omega_2$) gives:

$$B_u = -\overline{B}_x[\cos((\omega_1 - \omega_2)t) + \cos((\omega_1 + \omega_2)t)] + \qquad (73)$$

$$\overline{B}_y[-\sin((\omega_1 - \omega_2)t) - \sin((\omega_1 + \omega_2))t] - B_z\sin\omega_2 t -$$

$$\frac{G_{xx}a}{8}[-\sin((2\omega_1 - \omega_2)t) - \sin((2\omega_1 + \omega_2)t)] +$$

$$\frac{G_{xx}b}{16}[2\sin(2\omega_2 t) - \sin((2\omega_1 - 2\omega_2)t) + \sin((2\omega_1 + 2\omega_2)t)] +$$

$$\frac{G_{xy}a}{4}[-\cos((2\omega_1 - \omega_2)t) - \cos((2\omega_1 + \omega_2)t)] -$$

$$\frac{G_{xy}b}{8}[-\cos((2\omega_1 - 2\omega_2)t) + \cos((2\omega_1 + 2\omega_2)t)] +$$

$$\frac{G_{xz}a}{4}[\cos((\omega_1 - \omega_2)t) - \cos((\omega_1 + \omega_2)t)] -$$

$$\frac{G_{xz}b}{4}[\cos((\omega_1 - 2\omega_2)t) + \cos((\omega_1 + 2\omega_2)t)] +$$

$$\frac{G_{yy}a}{8}[-\sin((2\omega_1 - \omega_2)t) - \sin((2\omega_1 + \omega_2)t)] +$$

$$\frac{G_{yy}b}{16}[2\sin(2\omega_2 t) + \sin((2\omega_1 - 2\omega_2)t) - \sin((2\omega_1 + 2\omega_2)t)] -$$

$$\frac{G_{yz}a}{4}[-\sin((\omega_1 - \omega_2))t + \sin((\omega_1 + \omega_2)t)] +$$

$$\frac{G_{yz}b}{2}[-\sin((\omega_1 - 2\omega_2)t) - \sin((\omega_1 + 2\omega_2)t)] - \frac{3G_{zz}b}{8}\sin(2\omega_2 t)$$

Equation (73) shows that all vector and tensor components can be derived from the Fourier components of the output. If the rotation rates are chosen such that $\omega_1=5\omega_2$, for example, then the frequency components present in the signal are $f_2, 2f_2, 3f_2, 4f_2, 6f_2, 7f_2, 8f_2, 9f_2, 11f_2$, and $12f_2$, where $f_2=\omega_2/2\pi$. The vector and tensor components can be obtained from the discrete frequency components as follows:

$$\overline{B}_x = -\frac{Q(\omega_1 - \omega_2) + Q(\omega_1 + \omega_2)}{2}, \qquad (74)$$

$$\overline{B}_y = \frac{I(\omega_1 - \omega_2) + I(\omega_1 + \omega_2)}{2}, \overline{B}_z = -Q(\omega_2),$$

$$G_{xx} - G_{yy} = -\frac{8[Q(2\omega_1 - \omega_2) + Q(2\omega_1 + \omega_2)]}{a} =$$

$$\frac{8[Q(2\omega_1 - 2\omega_2) + Q(2\omega_1 + 2\omega_2)]}{b},$$

$$G_{xy} = \frac{4[I(2\omega_1 + 2\omega_2) - I(2\omega_1 - 2\omega_2)]}{b},$$

$$G_{xz} = -\frac{2[Q(\omega_1 - 2\omega_2) + Q(\omega_1 + 2\omega_2)]}{b},$$

$$G_{yz} = \frac{[I(\omega_1 - 2\omega_2) + I(\omega_1 + 2\omega_2)]}{b},$$

$$G_{zz} = -(G_{xx} + G_{yy}) = -\frac{8Q(2\omega_2)}{3b},$$

$$G_{xx} = \frac{8[Q(2\omega_2) + 3Q(2\omega_1 - 2\omega_2) + 3Q(2\omega_1 + 2\omega_2)]}{6b},$$

$$G_{yy} = \frac{8[Q(2\omega_2) - 3Q(2\omega_1 - 2\omega_2) - 3Q(2\omega_1 + 2\omega_2)]}{6b}$$

The angular velocities $\omega_1$ and $\omega_2$ should be commensurate and phase-locked, with their ratio chosen to ensure that different frequency components in the signal given by (73) do not coincide. As mentioned above, $\omega_1=5\omega_2$ fulfils this requirement. Many other choices, e.g. $\omega_1=2.5\omega_2$, or $\omega_1=7\omega_2$, are also suitable and in some embodiments, $\omega_2$ may be larger than $\omega_1$. In other embodiments, the angular velocities $\omega_1$ and $\omega_2$ may not be commensurate and phase locked provided the phase of each rotation is measured independently. The angular velocities $\omega_1$ and $\omega_2$ should be configured to allow clean separation of different frequency components in the signal. Commensurability may be desirable for digital implementation using a discrete Fourier transform, for example, as it may allow for clean separation of the frequency components. The absolute rotation rates should be chosen such that the lowest frequency component in the signal falls above the 1/f noise corner of the sensor, within the approximately white noise region. For many magnetometers (e.g. SQUIDs, fluxgates, AMR sensors) this corner frequency is in the order of 1 Hz. The minimum rotation rate should also be high enough that the relative changes in measured fields are small during a single complete cycle of the orbital motion. In some applications, where the relative velocity of the source and sensor may be high, the optimal rotation rate should be high enough to ensure that the measured field does not change substantially during one orbit.

The maximum lengths of the baselines a and b may be dictated by the available space within the instrument housing, which depends on the application. For downhole deployment, for example, baselines may be restricted to a few centimeters. Within the restrictions imposed by available space, it may be desirable for the baselines a and b to be of similar length, so that the resolution and noise levels of different gradient components are comparable.

The mechanism 120 may be configured to cause the sensor 110 to move relative to the fixed instrument reference frame X in a predetermined trajectory as described in relation to any one of FIGS. 2A to 10D, or any other described trajectories. In trajectories comprising a combination of two rotations having angular velocities $\omega_1$ and $\omega_2$, the first rotation motion $\omega_1$ may be driven by a first actuator 150, and the second rotation motion $\omega_2$ may be driven by a second actuator 150. Alternatively, the mechanism 120 may be configured to cause both the first and second rotation motions and be driven by a single actuator 150. For example, the mechanism 120 may include a set of cogs or gears with a predetermined ratio to couple the first rotation motion to the second rotation motion with a predetermined ratio between $\omega_1$ and $\omega_2$ and a fixed relative phase.

Figure 11:
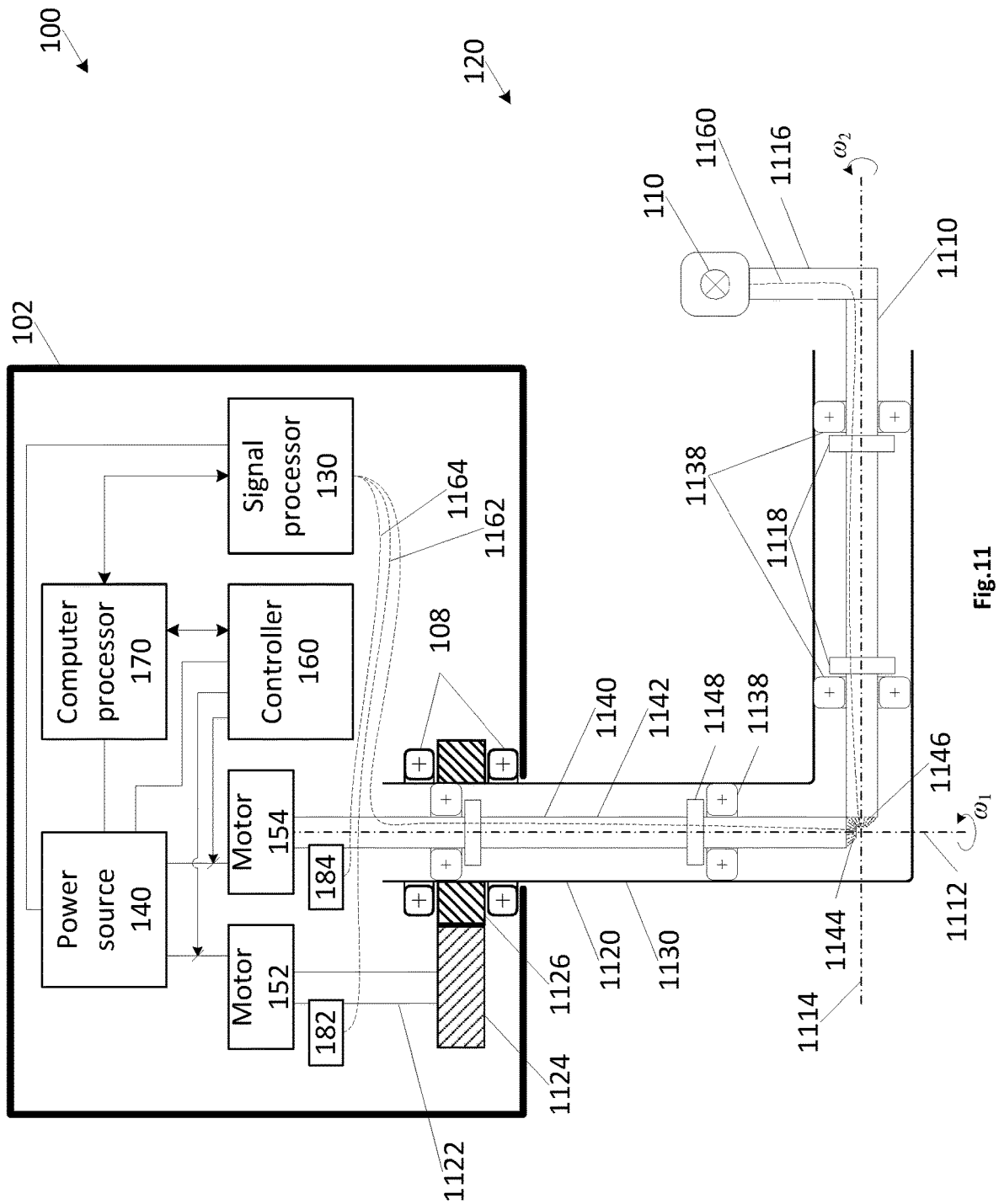
FIG. 11 is a schematic diagram of a measuring instrument according to some embodiments.

Referring to FIG. 11, a schematic diagram of a measuring instrument 100 is shown according to some embodiments. The measuring instrument 100 comprises: a sensor 110, a mechanism 120, a signal processor 130, a power source 140, actuators in the form of first and second motors 152 and 154, first and second angular position sensors 182 and 184 respectively associated with motors 152, 154, a controller 160, and a computer processor 170 as described in relation to FIG. 1.

The measuring instrument 100 comprises a body 102 which is fixed relative to a fixed reference frame X(x, y, z) of the instrument 100. The mechanism 120 is configured to cause relative motion between the sensor 110 and the fixed reference frame X of the instrument 100.

The mechanism 120 comprises a first member 1110 having a first axis 1112 and a second axis 1114 that is different from the first axis 1112. The mechanism 120 causes the first member 1110 to rotate about the first axis 1112, and causes the sensor 110 to rotate about the second axis 1114. The sensor 110 is spatially offset from the first axis 1112. In some embodiments, the sensor 110 is also spatially offset from the second axis 1114. The first axis 1112 may be spatially offset from the second axis 1114.

The mechanism 120 comprises a first sub-mechanism 1120 to cause the first member 1110 to rotate about the first axis 1112 and a second sub-mechanism 1140 to cause the sensor 110 to rotate about the second axis 1114. The second sub-mechanism 1140 may comprise the first member 1110. The first sub-mechanism 1120 may comprise a support 1130 to support the first member 1110. The support 1130 may be in the form of a sleeve, for example.

The first sub-mechanism 1120 is driven by the first motor 152 via a first drive shaft 1122, a first gear 1124 connected to the first drive shaft 1122, and a second gear 1126 coupled to the first gear 1124 and connected to the support 1130. The first and second gears 1124, 1126 may be in the form of spur gears. The first angular sensor 182 may be connected to the signal processor 130 and configured to measure an angular position of the first drive shaft 1122 to determine an angular position of the first sub-mechanism 1120.

The second sub-mechanism 1140 is driven by the second motor 154 via a second drive shaft 1142, a third gear 1144 connected to the second drive shaft 1142, and a fourth gear 1146 coupled to the third gear 1144 and connected to the first member 1110. The third and fourth gears 1144, 1146 may be in the form of bevel gears. The second angular sensor 184 may be connected to the signal processor 130 and configured to measure an angular position of the second drive shaft 1142 to determine an angular position of the second sub-mechanism 1140.

The first member 1110 may comprise an elongate arm. The second sub-mechanism 1140 may further comprise an arm extension 1116 to spatially offset the sensor 110 from the second axis 1114.

The first member 1110 may be supported in bearings 1138 mounted in the support 1130. The first member 1110 may further comprise radial protrusions or flanges 1118 configured to abut the bearings 1138 to restrict axial movement of the first member 1110 relative to the support 1130. The second drive shaft 1142 may also comprise radial protrusions 1148 configured to abut further bearings 1138 mounted in the support 1130 to restrict axial movement of the support 1130 relative to the second drive shaft 1142. Further bearings 108 may be mounted in the instrument body 102 and the support 1130 may be mounted in the bearings 108. The first and second motors 152, 154 may be mounted in the instrument body 102 and fixed with respect to the fixed reference frame X of the instrument 100.

The sensor 110 may be connected to the signal processor 130 by a cable 1160. The cable 1160 may extend through the arm extension 1116, the first member 1110 and the second drive shaft 1142 into the instrument body 102 to connect the sensor 110 to the signal processor 130. The first angular position sensor 182 may be connected to the signal processor 130 by cable 1162, and the second angular position sensor 184 may be connected to the signal processor 130 by cable 1164.

Figure 12:
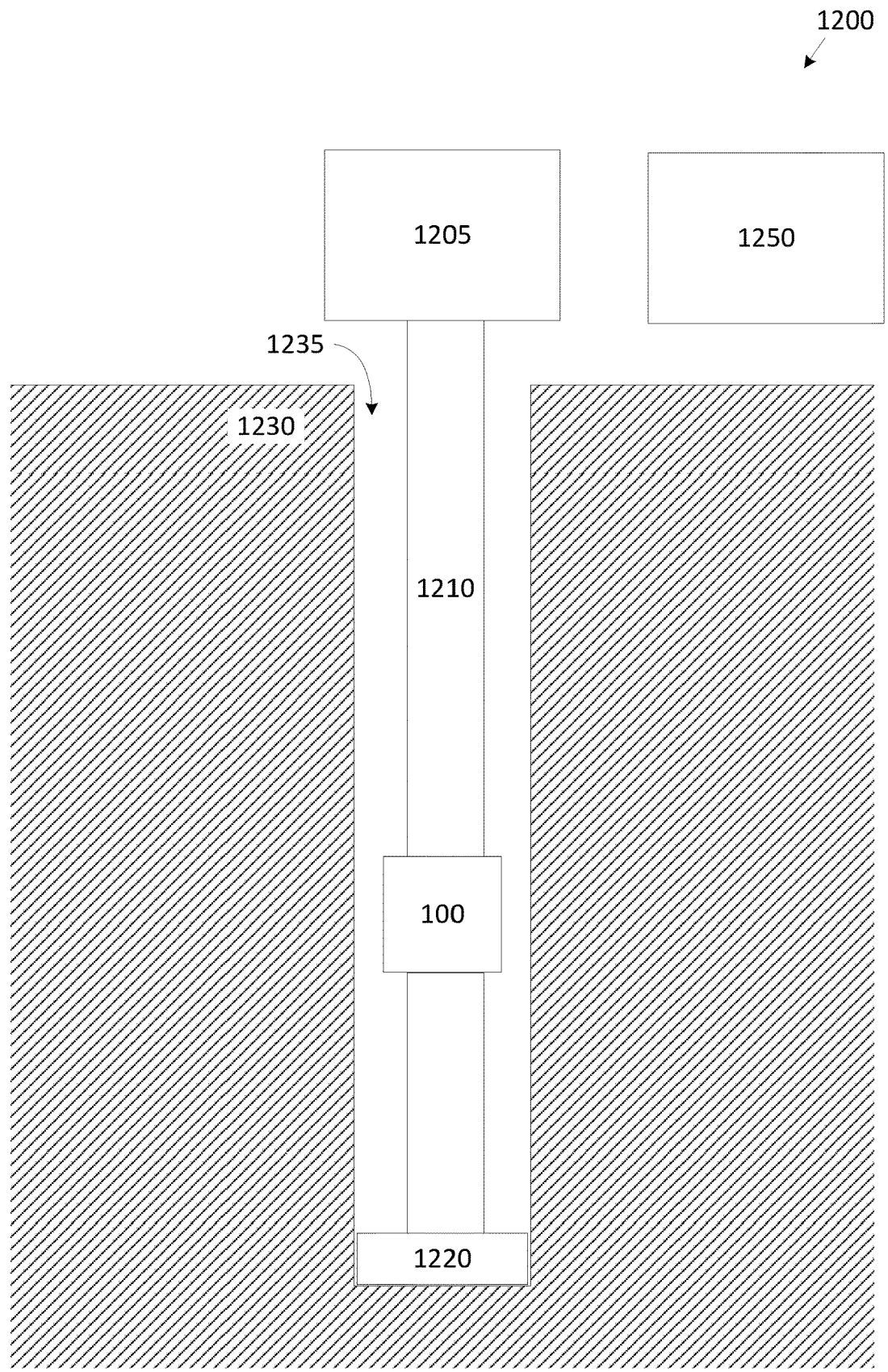
FIG. 12 is a schematic diagram of a drilling system comprising a measuring instrument according to some embodiments.

Some embodiments relate to a drilling system 1200 comprising a measuring instrument 100 as shown in FIG. 12. The drilling system 1200 may comprise a drilling rig 1205 to drive a drill string 1210 with a drill bit 1220. The drilling system 1200 may be used to cut into earth or rock 1230 to form a wellbore, hole or borehole 1235. The drill string 1210 may extend between the drilling rig 1205 and the drill bit 1220 within the borehole 1235 to allow the drilling rig 1205 to drive the drill bit 1220 to cut into the earth 1230. The drill string 1210 may comprise a hollow drill pipe configured to deliver drilling mud to the drill bit 1220. The drilling mud may be pumped from drilling rig 1205 at the surface, through the drill string 1210 to the drill bit 1220 and then flow back up the borehole 1235 through an annulus formed between the drill string 1210 and walls of the borehole 1235. The measuring instrument 100 may be mounted to the drill string 1210 and may be mounted relatively near to the drill bit 1220.

In some embodiments, a complete measuring instrument 100 as described above may be mounted on the drill string 1210. In such embodiments, the signal measured by the sensor 110 may be stored on memory in the computer processor 170 and accessed later, after the instrument 100 has been retrieved from the borehole 1235.

In other embodiments, some of the components of the measuring instrument 100 may be mounted on the drill string 1210 (downhole components) and other components of the measuring instrument 100 may be disposed at a remote location from the downhole components (remote components). Some of the remote components may be disposed in a remote module 1250 which may be disposed at the surface near the drilling rig 1205, or at another remote location.

The remote components may include any one or more of: the power source 140, signal processor 130, computer processor 170, controller 160, and the user interface 175. The downhole components may include the sensor 110 as well as any or all of the rest of the components of the instrument 100. Although, if all of the components of the instrument are downhole components mounted on the drill string 1210, then remote components may not be required.

In some embodiments, the downhole components may include the sensor 110, mechanism 120, actuator 150, angular position sensor 180, controller 160, power source 140, and a transmitter (not shown) to transmit the measured signals to the remote module 1250 comprising a receiver to receive the measured signals and input them to the signal processor 130 coupled to the computer processor 170 and user interface 175. The signal transmission may be performed wirelessly or via a cable or by mud-pulse telemetry.

The actuator(s) 150, or one of the actuators 150 could also be a remote component with a mechanism 120 capable of coupling the remote actuator 150 to the sensor 110 to drive the motion of the sensor 110. In embodiments with one or more remote actuators 150, the angular position sensors 180 may be coupled to or disposed near the actuator 150. For example, in a drilling application, one or more actuators 150, angular position sensors 180 or other components of the instrument 110 may be located at the surface, while the sensor system comprises downhole components located near a drill bit of the drilling system. Alternatively, the angular position sensors 180 may be downhole components, coupled to the sensor 110 or to the mechanism 120 and disposed near the sensor 110.

In some embodiments, the actuator 150 or one of the actuators 150 may comprise the drilling rig 1205. In embodiments with simple sensor trajectories comprising a single component of rotation $\omega_1$, the sensor 110 may simply be fixedly mounted to the drill string 1210 at some distance from an axis of rotation of the drill string 1210. The drilling rig 1205 and drill string would then comprise the actuator 150 and mechanism 120 and drive the orbital motion of the sensor 110.

In embodiments with sensor trajectories comprising a second component of rotation $\omega_2$, the instrument 100 may comprise a second actuator 150 such as an electric motor mounted to the drill string 1210 to drive the $\omega_2$ motion. If an electric motor is used and the sensor 110 is a magnetometer, the magnetic field of the motor should be taken into consideration when configuring the instrument 100. Magnetic interference from the motor may be mitigated by positioning the motor away from the sensor 110, using magnetic shielding to shield the motor (i.e., to shield the sensor 110 from the motor), and/or driving the rotation of the sensor 110 at frequencies that differ from the rotation rate of the motor so that interference from the motor can be identified and filtered out during signal processing.

Alternatively, the mechanism 120 may be configured to move the sensor 110 through both primary and secondary rotations being driven by a single actuator 150. For example, the rotation of the drilling rig 1205 may drive both primary and secondary rotations to move the sensor 110 through its trajectory without the need for a second actuator 150. This may be done through a set of gears, for example.

Figure 13A:
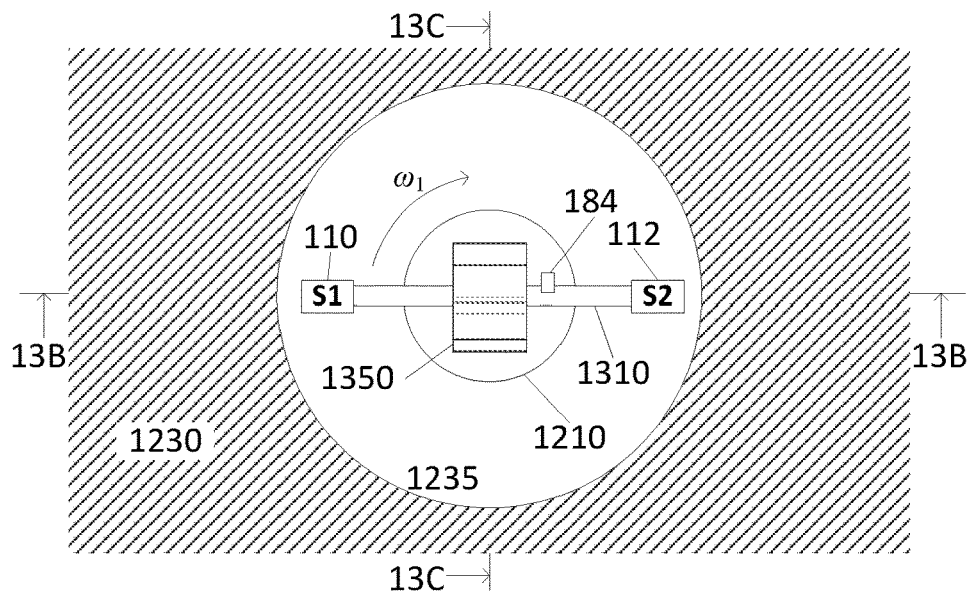
FIG. 13A is a plan view of a mechanism and components of a downhole measuring system according to some embodiments.
Figure 13B:
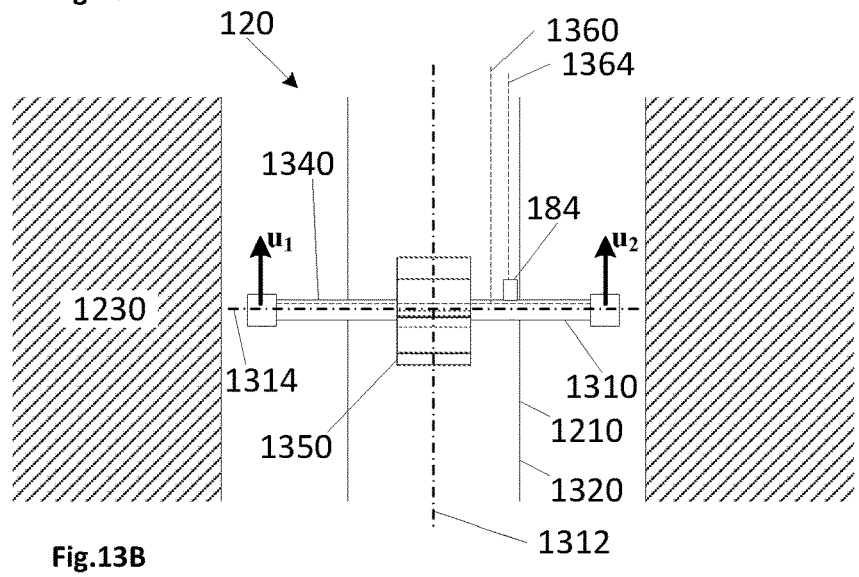
FIG. 13B is a first cross-section of the mechanism of FIG. 13A.
Figure 13C:
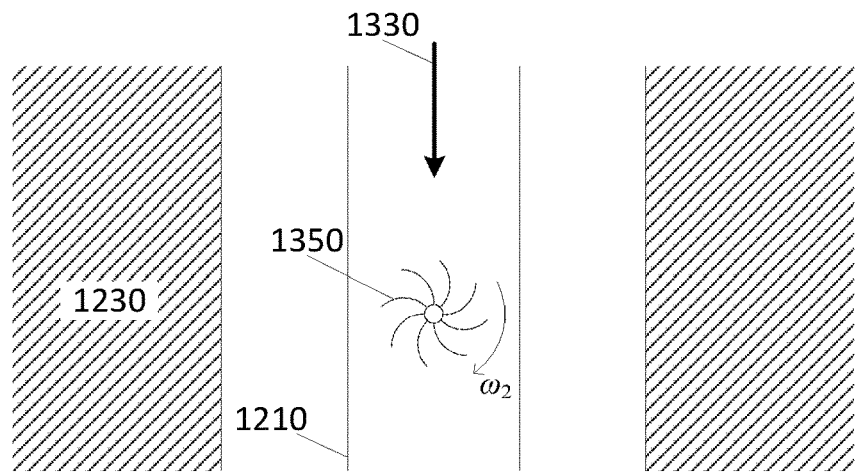
FIG. 13C is a second cross-section of the mechanism of FIG. 13A.

In some embodiments, the primary and/or secondary rotations may be driven by a downhole turbine mounted to the drill string 1210 and powered by the flow of drilling mud through the drill string 1210. Referring to FIGS. 13A to C, the downhole components of one such embodiment are shown.

The downhole components of the measuring instrument 100 shown in FIGS. 13A to 13C include a first sensor 110 (S1), a second sensor 112 (S2), a mechanism 120, an angular position sensor 184, and an actuator in the form of a turbine 1350. The mechanism 120 is configured to move the sensors 110, 112 in the trajectory described in relation to FIGS. 4A to 4D.

The mechanism 120 comprises a first member 1310 having a first axis 1312 and a second axis 1314 that is different from the first axis 1312. The first member is in the form of an elongate rod 1310 with the sensors 110, 112 fixedly mounted at opposing ends of the rod 1310. The sensors 110, 112 are mounted such that sensitive axes $u_1$ and $u_2$ of the sensors 110, 112 respectively remain parallel to each other. The first axis 1312 is the longitudinal axis of the drill string 1210 and the second axis 1314 is the longitudinal axis of the rod 1310.

The angular position sensor 184 is coupled to the rod 1310 to measure the angular position φ of the sensors 110, 112, and the signal measured by the angular position sensor 184 is then transmitted to the signal processor 130 via cable 1364. The angular position sensor 184 may be disposed within the lumen of the drill string 1210 as shown, or in some embodiments, may be disposed outside the drill string 1210 such as near the sensors 110, 112, for example. Another cable 1360 is coupled to the sensors 110, 112 to transmit the signal measured by the sensors 110, 112 to the signal processor 130.

The mechanism 120 comprises a first sub-mechanism 1320 to cause the rod 1310 to rotate about the first axis 1312 (i.e., the primary rotation $\omega_1$) and a second sub-mechanism 1340 to cause the sensors 110, 112 to rotate about the second axis 1314 (i.e., the secondary rotation $\omega_2$). The first sub-mechanism 1320 comprises the drill string 1210, which is driven by an actuator 150 which in this case comprises the drilling rig 1205.

The second sub-mechanism 1340 comprises the rod 1310 pivotally coupled to the drill string 1210 and is driven by the turbine 1350. The rod 1310 may be mounted in sealed bearings (not shown) so that the rod 1310 passes through the drill string 1210 from one side to another. The turbine 1350 is mounted to the rod 1310 such that the turbine 1350 is disposed within a lumen of the drill string 1210.

When drilling mud is pumped through the drill string 1210 in the direction shown by arrow 1330, the turbine 1350 is driven by the pressure of the drilling mud to rotate the rod 1310 and consequently the sensors 110, 112 to cause the secondary rotation $\omega_1$. Alternatively, the turbine 1350 could be disposed in the annulus formed between the drill string 1210 and the walls of the borehole 1235 and driven by the pressure of the drilling mud returning back up the borehole 1235 to the surface.

Together, the first and second sub-mechanisms cooperate to move the sensors 110, 112 in the trajectory shown in FIGS. 4A to 4D. Simply removing one of the sensors 110, 112 would result in the single sensor trajectory shown in FIGS. 3A to 3D.

Various other mechanisms 120 may be configured to cause one or more sensors 110 to move through any one of the sensor trajectories described above.

It will be appreciated by persons skilled in the art that numerous variations and/or modifications may be made to the above-described embodiments, without departing from the broad general scope of the present disclosure. Therefore, the present embodiments are, to be considered in all respects as illustrative and not restrictive.

The invention claimed is:

1. A measuring instrument comprising:
    a sensor to measure a property of the local environment;
    a mechanism configured to cause the sensor to move along a predetermined path relative to a fixed reference frame of the instrument; and
    a signal processing system configured to receive a sensor signal generated by the sensor, perform a Fourier transform on the sensor signal to identify frequency components of the sensor signal, and compare the frequency components of the sensor signal with frequency components associated with the predetermined path to determine a measurement of the property of the local environment;
    wherein the mechanism comprises a first member,
    wherein the first member has a first axis and a second axis that is different from the first axis,
    wherein the mechanism is configured to cause the first member and the sensor to rotate about the first axis, and to cause the sensor to rotate about the second axis,
    wherein the sensor is spatially offset from the first axis,
    wherein rotation of the sensor and the first member about the first axis has a first angular velocity and rotation of the sensor about the second axis has a second angular velocity, and
    wherein rotation of the sensor and the first member about the first axis is coupled to rotation of the sensor about the second axis such that the first angular velocity is related to the second angular velocity by a predetermined ratio between the first and second angular velocities.

2. A measuring instrument according to claim 1, (i) wherein the sensor spatially offset from the second axis, (ii) wherein the second axis is spatially offset from the first axis, or (iii) wherein the sensor is spatially offset from the second axis and wherein the second axis is spatially offset from the first axis.

3. A measuring instrument according to claim 1, wherein the sensor is a first sensor and the measuring instrument further comprises a second sensor offset from the first axis on an opposite side of the first axis from the first sensor, and
    wherein the mechanism is configured to cause the second sensor to rotate about the first axis in the same direction and with the same angular velocity as the first sensor, and to cause the second sensor to rotate about the second axis in the same direction and with the same angular velocity as the first sensor, and
    wherein the signal processing system is configured to receive sensor signals generated by the first and second sensors, perform Fourier transforms on the sensor signals to identify frequency components of the sensor signals, and compare the frequency components of the sensor signals with frequency components associated with the predetermined path to determine a measurement of the property of the local environment.

4. A measuring instrument according to claim 3, wherein the second axis is perpendicular to the first axis.

5. A measuring instrument according to claim 3, wherein the second axis is inclined at an acute angle relative to the first axis.

6. A measuring instrument according to claim 3, wherein the first and second angular velocities are phase-locked.

7. A measuring instrument according to claim 3, wherein the first and second angular velocities are variable with time.

8. A measuring instrument according to claim 1, wherein the mechanism comprises:
   a first sub-mechanism to cause the first member and the sensor to rotate about the first axis; and
   a second sub-mechanism to cause the sensor to rotate about the second axis,
   wherein the second sub-mechanism comprises the first member, and
   wherein the first sub-mechanism comprises a support to support the first member.

9. A drilling system comprising:
   a measuring instrument according to claim 8;
   a drill bit for cutting a borehole in rock or earth;
   a drill string to drive the drill bit, the drill string having a lumen to deliver drilling mud to the drill bit; and
   a drilling rig to drive rotation of the drill string and drill bit,
   wherein at least part of the measuring instrument is mounted to the drill string.

10. A drilling system according to claim 9, wherein at least part of the mechanism is driven by the drilling rig.

11. A drilling system according to claim 9, wherein at least part of the mechanism is driven by drilling mud pressure via a turbine coupled to the mechanism.

12. A drilling system according to claim 9, wherein the first sub-mechanism comprises the drill string, and
   wherein the second sub-mechanism comprises a turbine positioned within the lumen of the drill string to drive the second sub-mechanism.

13. A measuring instrument according to claim 3, wherein rotation of the second sensor about the second axis is out of phase relative to rotation of the first sensor about the second axis.

14. A measuring instrument according to claim 3, wherein rotation of the second sensor about the second axis is about ninety degrees (90°) out of phase relative to rotation of the first sensor about the second axis.

15. A measuring instrument according to claim 3, (i) wherein the sensors are configured to measure the field strength, (ii) wherein the sensors are configured to measure one or more vector components of a local force field, or (iii) wherein the sensors are configured to measure the field strength and wherein the sensors are configured to measure one or more vector components of a local force field.

16. A measuring instrument according to claim 15, wherein the local force field to be measured is one of: a magnetic field, an electric field, and a gravitational field.

17. A measuring instrument according to claim 3, wherein the sensors comprise one or more selected from: a magnetometer, a total magnetic intensity magnetometer, a uniaxial magnetometer, and a fluxgate magnetometer.

18. A measuring instrument according to claim 3, further comprising one or more angular position sensors connected to the signal processor to provide angular position information for one or more components of the mechanism.

19. A drilling system comprising:
   a measuring instrument according to claim 3;
   a drill bit for cutting a borehole in rock or earth;
   a drill string to drive the drill bit, the drill string having a lumen to deliver drilling mud to the drill bit; and
   a drilling rig to drive rotation of the drill string and drill bit,
   wherein at least part of the measuring instrument is mounted to the drill string.

20. A measuring instrument according to claim 1, further comprising a second member coupled to the first member, the second member having a third axis which is different from the first and second axes,
   wherein the mechanism is configured to cause the second member to rotate about the first axis.

* * * * *

UNITED STATES PATENT AND TRADEMARK OFFICE
CERTIFICATE OF CORRECTION

PATENT NO. : 10,626,720 B2
APPLICATION NO. : 15/747012
DATED : April 21, 2020
INVENTOR(S) : David Alan Clark Page 1 of 1

It is certified that error appears in the above-identified patent and that said Letters Patent is hereby corrected as shown below:

In the Claims

Claim 2, Column 40, Line 50, after "sensor" and before "spatially" insert --is--

Signed and Sealed this
Twenty-sixth Day of May, 2020

Andrei Iancu
*Director of the United States Patent and Trademark Office*